United States Patent
Moriwaki

(10) Patent No.: US 9,160,315 B2
(45) Date of Patent: Oct. 13, 2015

(54) RING OSCILLATOR AND SEMICONDUCTOR DEVICE

(71) Applicant: SOCIONEXT INC., Yokohama, Kanagawa (JP)

(72) Inventor: Shinichi Moriwaki, Fussa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/108,024

(22) Filed: Dec. 16, 2013

(65) Prior Publication Data
US 2014/0210561 A1   Jul. 31, 2014

(30) Foreign Application Priority Data

Jan. 31, 2013   (JP) .................................. 2013-017080

(51) Int. Cl.
*H03K 3/03*   (2006.01)
*G11C 29/12*   (2006.01)
*G11C 7/22*   (2006.01)

(52) U.S. Cl.
CPC .............. *H03K 3/0315* (2013.01); *G11C 7/222* (2013.01); *G11C 29/12015* (2013.01)

(58) Field of Classification Search
CPC .... H03K 3/0315; G11C 11/41; G11C 11/412; G11C 11/419; G11C 29/12015; G11C 7/22; G11C 7/222; G11C 7/227; G11C 29/50012; G11C 2029/0403
USPC ................. 331/57; 365/154, 156, 210.1, 201, 365/189.03, 189.19
See application file for complete search history.

(56) References Cited

U.S. PATENT DOCUMENTS

| | | | |
|---|---|---|---|
| 7,142,064 B2 * | 11/2006 | Chan et al. ....................... | 331/57 |
| 7,868,706 B2 * | 1/2011 | Nissar et al. ..................... | 331/57 |
| 8,804,445 B2 * | 8/2014 | Chuang et al. ................. | 365/201 |
| 2004/0061561 A1 * | 4/2004 | Monzel et al. .................. | 331/57 |
| 2006/0050600 A1 * | 3/2006 | Venkatraman et al. ....... | 365/233 |
| 2010/0073982 A1 | 3/2010 | Asayama et al. | |

FOREIGN PATENT DOCUMENTS

| | | |
|---|---|---|
| JP | 60-072319 A | 4/1985 |
| JP | 10-242806 A | 9/1998 |
| JP | 2010-073282 A | 4/2010 |

OTHER PUBLICATIONS

Korean Office Action issued Feb. 12, 2015; Korean Application No. 10-2013-0164295, with English Translation.

* cited by examiner

*Primary Examiner* — Ryan Johnson
(74) *Attorney, Agent, or Firm* — Arent Fox LLP

(57) ABSTRACT

There are provided a ring oscillator having a plurality of delay circuits to be ring-connected. At least one of the plurality of delay circuits has a delay element formed in a layout region including the same layout shape as the layout shape of an SRAM cell, and a path circuit connected in parallel to the delay element. The delay element outputs an output signal to a delay circuit in the next stage within the plurality of delay circuits in response to one of rise transition and fall transition of a signal input to the input terminal of the delay element from a delay circuit in the previous stage within the plurality of delay circuits. The path circuit outputs an output signal to the delay circuit in the next stage in response to the transition other than the one transition.

10 Claims, 21 Drawing Sheets

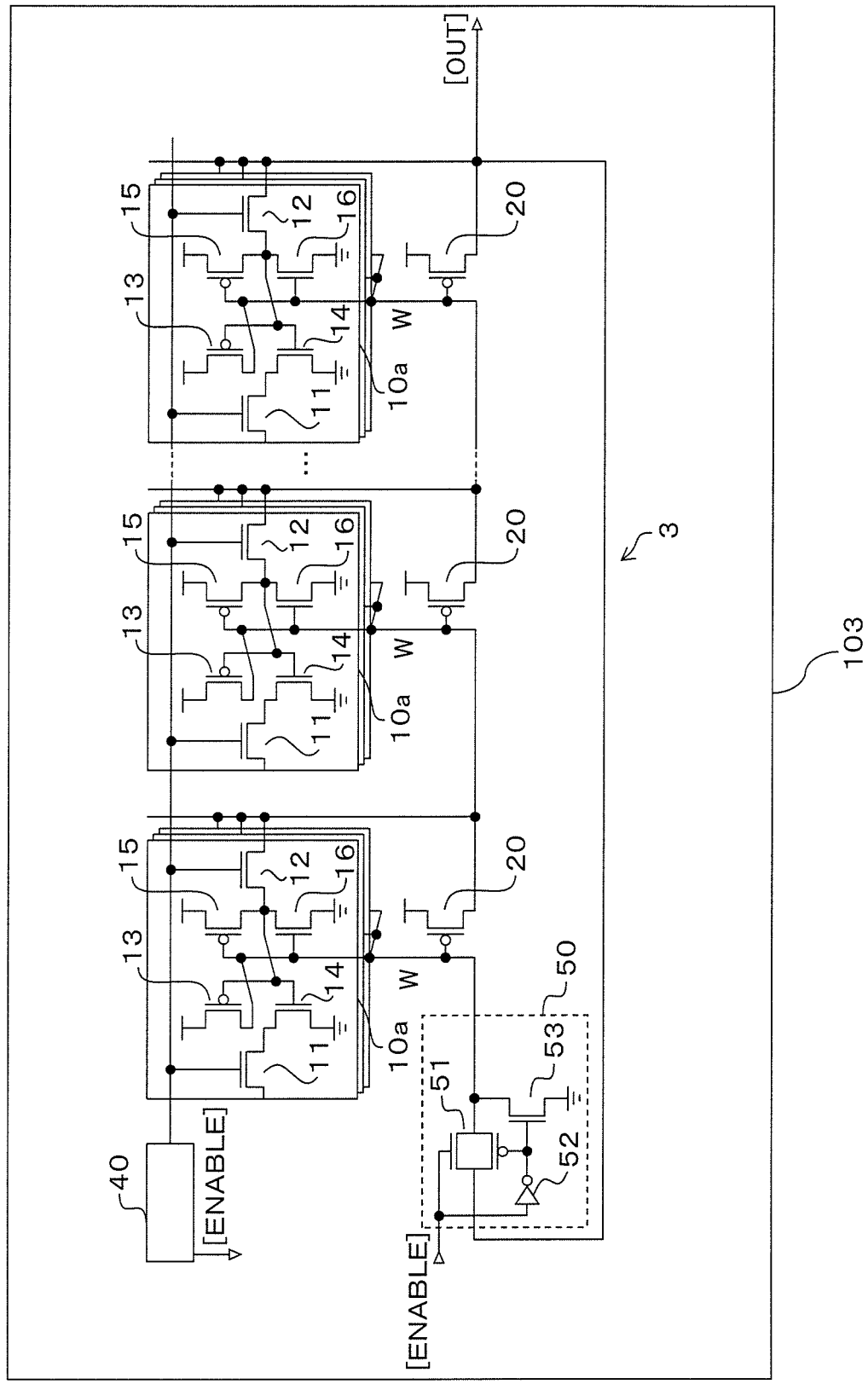

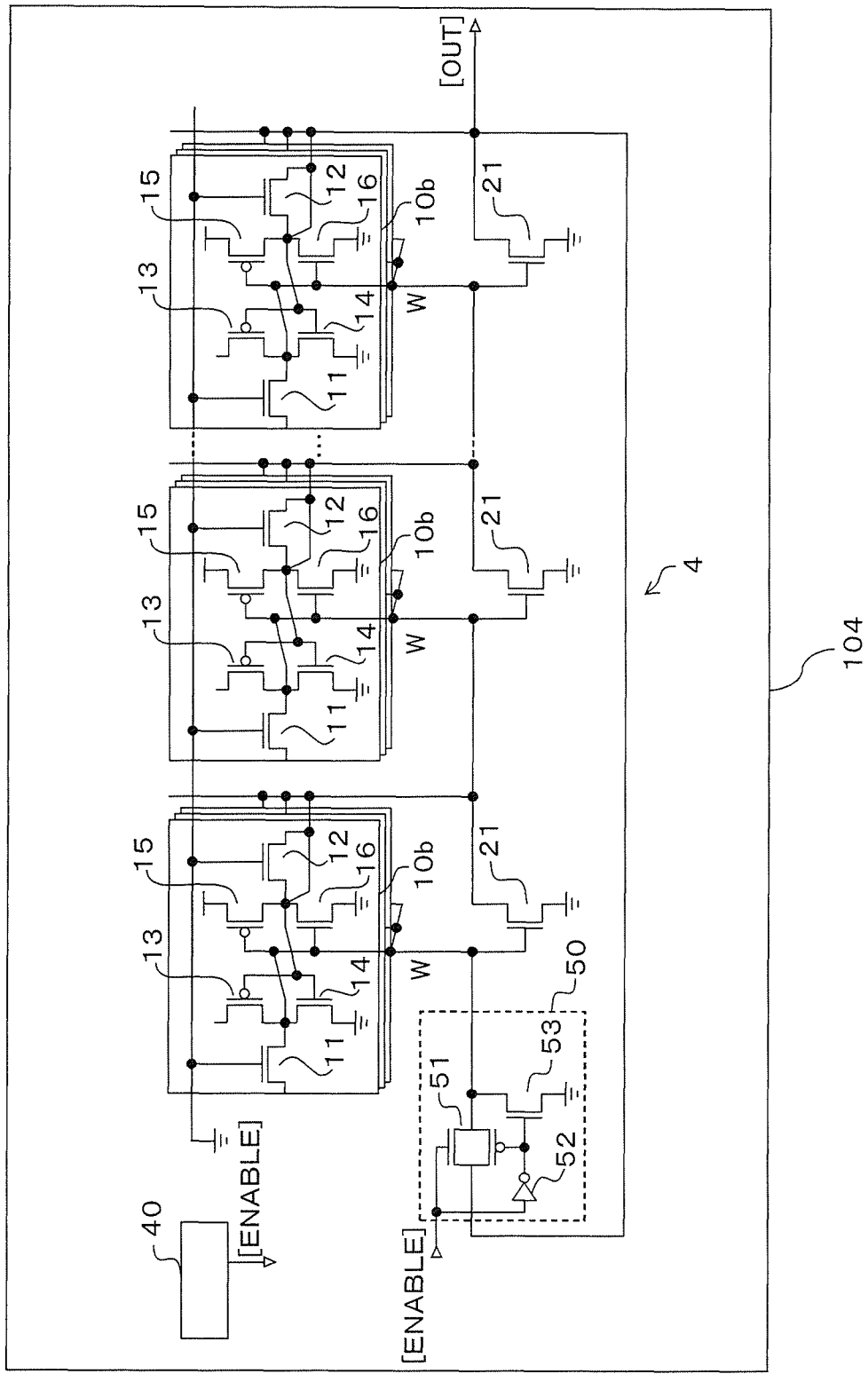

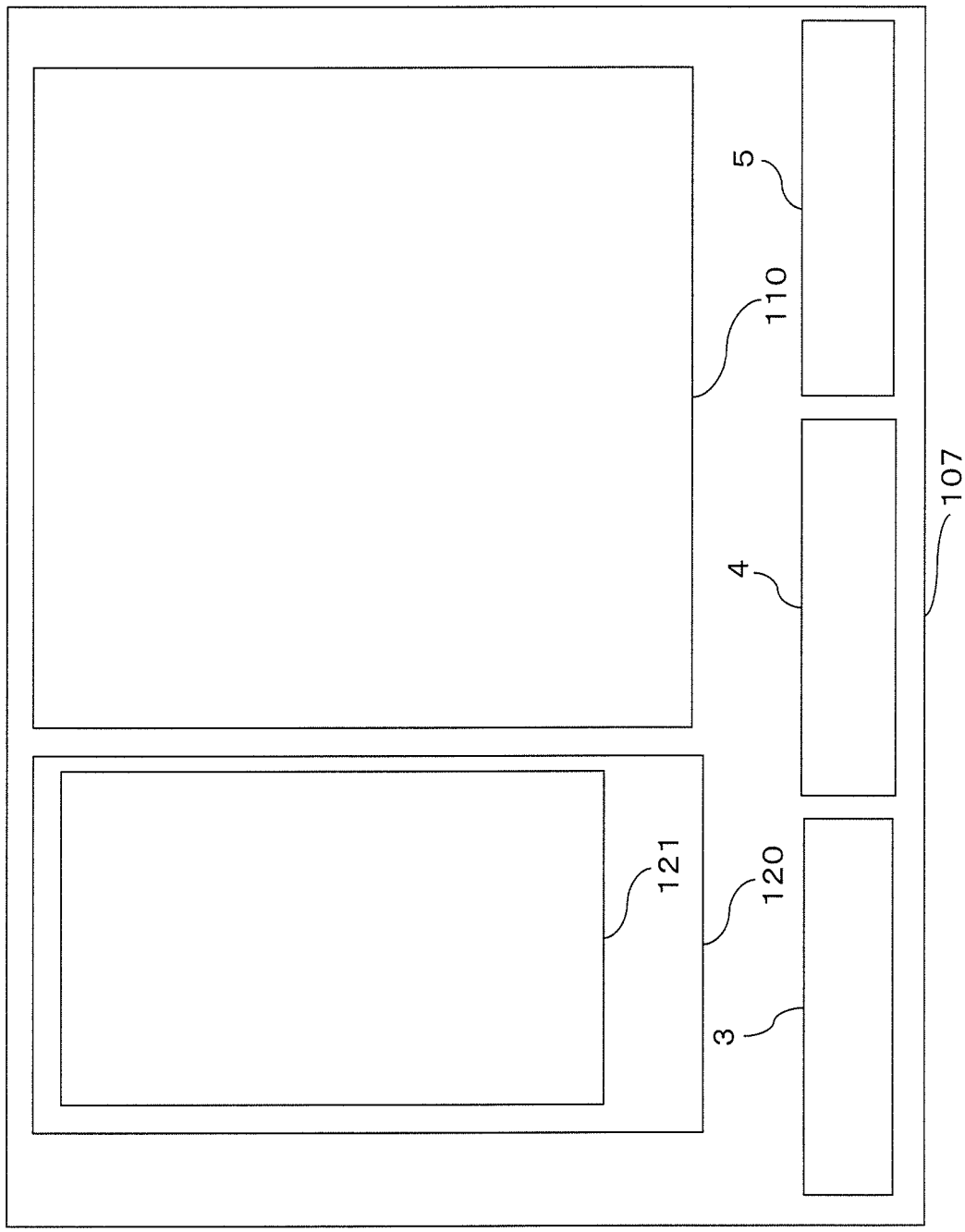

RING OSCILLATOR AND SEMICONDUCTOR DEVICE

CROSS-REFERENCE TO RELATED APPLICATIONS

This application is based upon and claims the benefit of priority of prior Japanese Patent Application No. 2013-017080, filed on Jan. 31, 2013, the entire contents of which are incorporated herein by reference.

FIELD

The embodiments discussed herein are related to a ring oscillator and a semiconductor device.

BACKGROUND

It is known to adjust the electrical characteristics of an SRAM cell by changing the body potential of the well of a transistor etc., which is a component of the SRAM cell, or the potential of the word line in order to suppress the influence of manufacturing variations of the semiconductor device on which the SRAM cell is mounted. It is possible to measure the electrical characteristics of the transistor, such as the on-current and the threshold voltage, used when adjusting the electrical characteristics of the SRAM cell as analog signals by using an electric probe, etc. However, in such measurement, analog signals are measured, and therefore, the measurement is vulnerable to various kinds of measurement noises and it is not easy to perform measurement with high precision.

On the other hand, it is known to use a ring oscillator in order to evaluate the speed characteristic of various kinds of elements to be mounted on the semiconductor device. A ring oscillator is formed by ring-connecting a single or a plurality of non-inversion elements and an odd number of inversion elements.

Further, there is known a semiconductor device having a logic part forming a logic circuit and a memory part formed by a plurality of SRAM cells laid out in the form of an array. In such a semiconductor device, various kinds of logic elements of the transistors laid out in the logic part are laid out based on the same layout wiring rules. On the other hand, the SRAM cells laid out in the memory part are laid out, in many cases, based on layout wiring rules different from those of the transistors used in the logic part forming the logic circuit. Since an SRAM cell generally has a six-transistor configuration, layout wiring rules in which the layout intervals are narrowed as much as possible are adopted in order to prevent the layout wiring area from increasing.

It is known to use a ring oscillator formed by ring-connecting a plurality of SRAM cells in order to evaluate the speed of the SRAM cells to be laid out based on layout wiring rules different from those of the logic part. For example, a ring oscillator formed by ring-connecting a plurality of SRAM cells in which the gate and the drain of a pair of transmission transistors are connected to each other is used. By connecting the output terminal of an inverter element inside the SRAM cell and the drain of the transmission transistor of the SRAM cell, delay circuits configured to output an inverted signal are ring-connected.

RELATED DOCUMENTS

[Patent Document 1] Japanese Laid Open Patent Document No. 2010-73282

[Patent Document 2] Japanese Examined Patent Document No. 04-30764

[Patent Document 3] Japanese Laid Open Patent Document No. 10-242806

SUMMARY

However, in a ring oscillator formed by ring-connecting the output terminal of the inverter element and the drain of the transmission transistor, there has been a problem that it is not possible to individually measure the rise delay time and the fall delay time of the component of the SRAM cell. That is, in such a ring oscillator, the rise delay time and the fall delay time of the component of the SRAM cell are measured at the same time, and therefore, there has been a problem that it is not possible to separately measure the rise delay time and the fall delay time, respectively.

According to an aspect of the embodiments, a ring oscillator has a plurality of delay circuits ring-connected. At least one of the plurality of delay circuits has a delay element formed in a layout region including the same layout shape as the layout shape of an SRAM cell, and a path circuit connected in parallel to the delay element. The delay element outputs an output signal to a delay circuit in the next stage within the plurality of delay circuits in response to one of rise transition and fall transition of a signal input to the input terminal of the delay element from a delay circuit in the previous stage within the plurality of delay circuits. The path circuit outputs an output signal to the delay circuit in the next stage in response to the transition other than the one transition.

The object and advantages of the embodiments will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

FIG. 9 is a diagram illustrating still other aspect of ring oscillator.

FIG. 13 is a diagram illustrating still other aspect of ring oscillator.

FIG. 21 is a diagram illustrating a semiconductor device 107 on which a plurality of ring oscillators are mounted.

DESCRIPTION OF EMBODIMENTS

Figure 1:
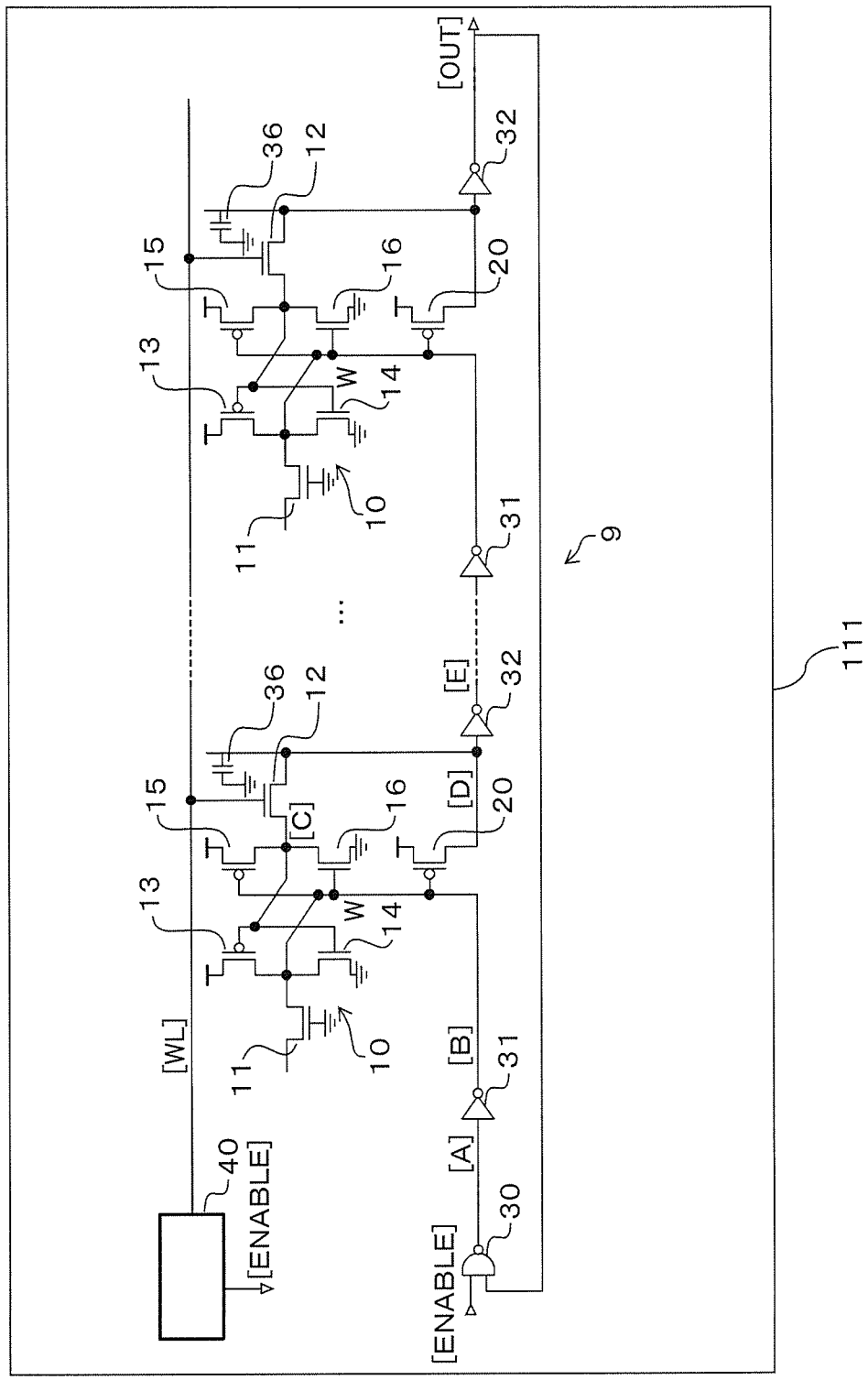
FIG. 1 is a diagram illustrating a ring oscillator relating to the embodiment.
Figure 2:
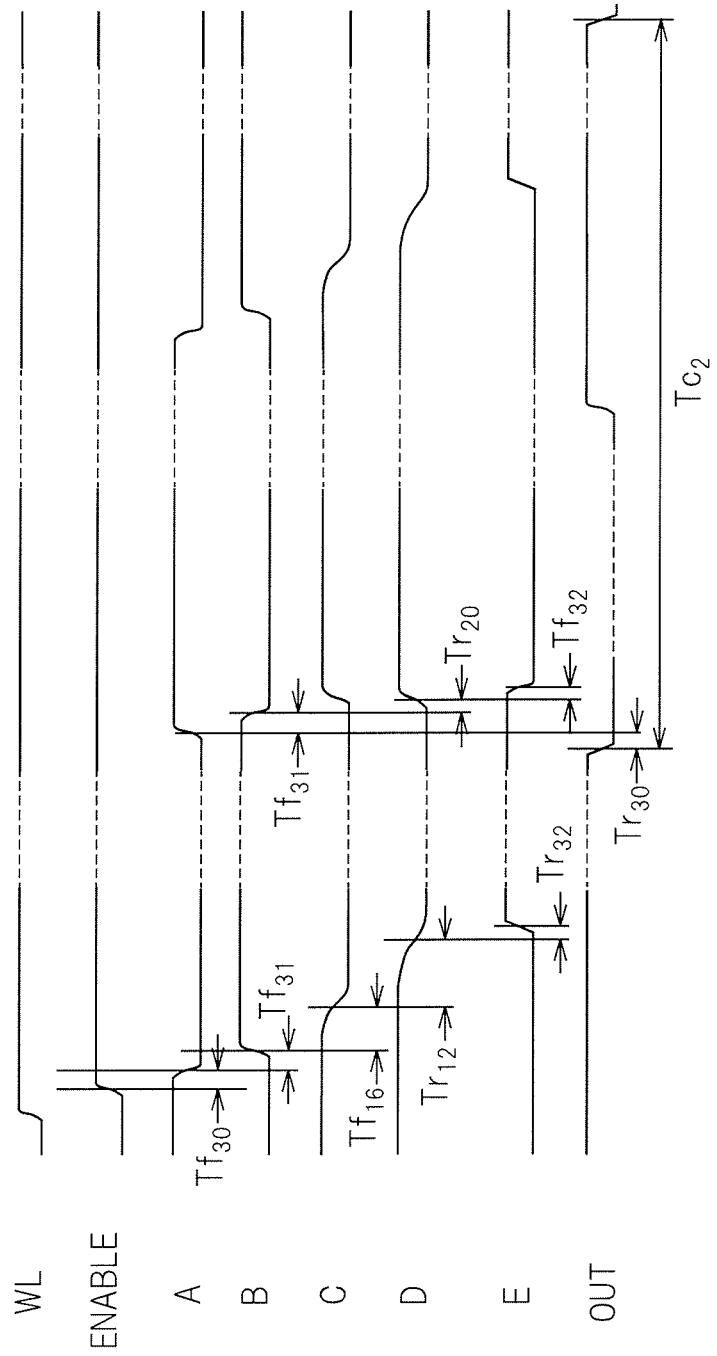
FIG. 2 is a timing chart of the ring oscillator described in FIG. 1

First, with reference to FIGS. 1 and 2, a ring oscillator relating to the embodiment is explained.

FIG. 1 is a diagram illustrating a ring oscillator 9 relating to the embodiment.

The ring oscillator 9 has a plurality of SRAM cells 10 formed on a semiconductor device 111 and part of components of which are connected to the ring oscillator 9, a plurality of pull-up elements 20, a NAND element 30, a plurality of inverter elements 31 and 32, and a control unit 40.

The SRAM cell 10 is an SRAM cell having a six-transistor configuration. The SRAM cell 10 has a first transmission transistor 11 and a second transmission transistor 12. The SRAM cell 10 further has a first pull-up transistor 13 and a first pull-down transistor 14, and a second pull-up transistor 15 and a second pull-down transistor 16.

The first transmission transistor 11 and the second transmission transistor 12 are each an nMOS transistor.

The gate of the first transmission transistor 11 is connected to VSS and the first transmission transistor 11 is always in the off state. The source of the first transmission transistor 11 is connected to the output terminal of the inverter element 31. The drain of the first transmission transistor 11 is brought into the open state.

The gate of the second transmission transistor 12 is connected to the word line. The drain of the second transmission transistor 12 is connected to the drain of the pull-up element 20 and the input terminal of the inverter element 32.

In the first transmission transistor 11 and the second transmission transistor 12, a current flows in both directions, and therefore, the source and the drain are not determined uniquely. Thus, in the present specification, the terminals of the first transmission transistor 11 and the second transmission transistor 12 connected to the components of the SRAM cell 10 are referred to as sources. In other words, the terminals connected to the first pull-up transistor 13 and the second pull-up transistor 15, and to the first pull-down transistor 14 and the second pull-down transistor 16 are referred to as sources. On the other hand, in the present specification, the terminals of the first transmission transistor 11 and the second transmission transistor 12 connected to external elements of the SRAM cell 10 via the bit line are referred to as drains. In the ring oscillator 9, the drain of the first transmission transistor 11 is connected to the drains of the first pull-up transistor 13 and the first pull-down transistor 14 via a wire W. Further, to the wire W, the gates of the second pull-up transistor 15 and the second pull-down transistor 16 are connected.

The first pull-up transistor 13 and the second pull-up transistor 15 are each a pMOS transistor. Each source of the first pull-up transistor 13 and the second pull-up transistor 15 is connected to VDD.

The first pull-down transistor 14 and the second pull-down transistor 16 are each an nMOS transistor. Each source of the first pull-down transistor 14 and the second pull-down transistor 16 is connected to VSS.

The above-described six transistors forming the SRAM cell are laid out and wired on the semiconductor device 111 based on layout wiring rules whose intervals are narrower than those of the logic circuit elements, such as the plurality of pull-up elements 20, the plurality of NAND elements 30, and the plurality of inverter elements 31 and 32. In other words, the layout region in which the SRAM cell is formed is formed based on layout wiring rules different from those of the region in which the logic circuit elements are formed.

The pull-up element 20 has a pMOS transistor. The pMOS transistor forming the pull-up element 20 is laid out so that the operation speed is ten times the operation speed of the first transmission transistor 11.

The gate of the pull-up element 20 is connected to the output terminal of the inverter element 31 via the wire W, and the source of the pull-up element 20 is connected to VDD. The drain of the pull-up element 20 is connected to the drain of the second transmission transistor 12 and to the input terminal of the inverter element 32.

The pull-up element 20 has a function for causing the signal level of a signal at the drain of the second transmission transistor 12 of the SRAM cell 10 connected in parallel to transit to rise from the L level (low-potential power source voltage, for example, VSS) to the H level (high-potential power source voltage, for example, VDD). If the signal levels at the source of the first transmission transistor 11 and at the output terminal of the inverter element 31 transit to fall, the pull-up element 20 supplies an H-level signal to the source of the first transmission transistor 11. On the other hand, if the signal level at the output terminal of the inverter element 31 transits to rise, the pull-up element 20 enters the off state and the drain of the pull-up element 20 enters a high-impedance state. The pull-up element 20 is connected in parallel to each of the plurality of SRAM cells 10 and functions as a compensation path circuit configured to output a rise signal to the inverter element 32. In other words, in the case where the inverter element 31 outputs a rise signal, the signal propagates to the inverter element 32 via the SRAM cell 10. On the other hand, in the case where the inverter element 31 outputs a fall signal, the signal propagates to the inverter element 32 via the pull-up element 20.

The first input terminal of the NAND element 30 is connected to the control unit 40 and the second input terminal of the NAND element 30 is connected to the output terminal of the inverter element 32 in the final stage. The output terminal of the NAND element 30 is connected to the input terminal of the inverter element 31 in the initial stage.

If an H-level signal is input to the first input terminal of the NAND element 30, the ring oscillator 9 enters the oscillation state and if an L-level signal is input to the first input terminal of the NAND element 30, the ring oscillator 9 enters the oscillation stopped state.

While the H-level signal is being input to the first input terminal of the NAND element 30, if the L-level signal is input to the second input terminal, the output terminal of the NAND element 30 outputs the H-level signal. On the other hand, while the H-level signal is being input to the first input terminal of the NAND element 30, if the H-level signal is input to the second input terminal, the output terminal of the NAND element 30 outputs the L-level signal. In the ring oscillator 9, the output terminal and the second input terminal of the NAND element 30 are ring-connected, and therefore, when the H-level signal is input to the first input terminal, the ring oscillator 9 oscillates in a period in accordance with the delay speed of the element to be connected.

The inverter elements 31 and 32 are connected in series via the SRAM cell 10 and the pull-up element 20 connected between the inverter elements 31 and 32. The inverter elements 31 and 32 are connected in series for each of the plurality of SRAM cells 10.

The input terminal of the inverter element 31 in the initial stage is connected to the output terminal of the NAND element 30. The output terminal of the inverter element 32 in the initial stage is connected to the input terminal of the inverter element 31 in the second stage. Then, the output terminal of the inverter element 32 in the previous stage is connected to the input terminal of the inverter element 31 in the next stage. Then, the output terminal of the inverter element 32 in the final stage is connected to one of the input terminals of the NAND element 30.

The control unit 40 has a plurality of logic elements and brings the ring oscillator 9 into the oscillation state based on a command signal input from the outside of the semiconductor device 111. Upon receipt of a command signal, the control unit 40 supplies the H-level signal to the word line and then supplies the H-level signal to the first input terminal of the NAND element.

Next, the operation of the components of the ring oscillator 9 in the oscillation state is explained.

FIG. 2 is a timing chart of the ring oscillator 9.

A waveform [ENABLE] is a waveform of an enable signal to be input to the first input terminal of the NAND element 30. When the waveform [ENABLE] is at the H level, the ring oscillator 9 enters the oscillation state. A waveform [WL] is a waveform of a word line signal to be input to the gate of the first transmission transistor 11. When the waveform [WL] is at the H level, the second transmission transistor 12 is activated.

A waveform [A] is a waveform of an output signal of the NAND element 30. A waveform [B] is a waveform of an output signal of the inverter element 31. A signal having the waveform indicated by the waveform [B] is input to the source of the first transmission transistor 11 and to the gate of the pull-up element 20, respectively, via the wire W.

A waveform [C] is a waveform of a signal at the source of the second transmission transistor 12. A waveform [D] is a waveform of a signal at the drain of the second transmission transistor 12 and at the drain of the pull-up element 20. A waveform [E] is a waveform of an output signal of the inverter element 32. A signal having the waveform indicated by the waveform [E] is input to the input terminal of the inverter element 31 in the next stage.

A waveform [OUT] is a waveform of an output signal of the inverter element 32 in the final stage. A signal having the waveform indicated by the waveform [OUT] is input to the second input terminal of the NAND element.

As indicated by the waveform [WL], upon receipt of a command signal, the control unit 40 supplies the H-level signal to the word line. By supplying the H-level signal to the word line, the second transmission transistor 12 is activated.

Next, as indicated by the waveform [ENABLE], the ring oscillator 9 enters the oscillation state by supplying the H-level signal to the first input terminal of the NAND element 30 from the control unit 40.

Next, as indicated by the waveform [A], when a time $Tf_{30}$ elapses after the H-level signal is input to the first input terminal, the NAND element 30 outputs the L-level signal to the input terminal of the inverter element 31. The time $Tf_{30}$ is the fall delay time of the NAND element 30.

Next, as indicated by the waveform [B], when a time $Tr_{31}$ elapses after the L-level signal is input to the input terminal, the inverter element 31 outputs the H-level signal to the gate of the second pull-down transistor 16, to the gate of the pull-up element 20, etc. The time $Tr_{31}$ is the rise delay time of the inverter element 31.

Next, as indicated by the waveform [C], when a time $Tf_{16}$ elapses after the H-level signal is input to the input terminal, the signal at the drain of the second pull-down transistor 16 turns to the L-level signal. The time $Tf_{16}$ is the delay time when the signal at the drain of the second pull-down transistor 16 transits to fall. The signal at the drain of the second pull-down transistor 16 is equivalent to the signal at the source of the second transmission transistor 12.

Next, as indicated by the waveform [D], when a time $Tf_{12}$ elapses after the signal at the source of the second transmission transistor 12 turns to the L level, the signal at the drain of the second transmission transistor 12 turns to the L-level signal. The time $Tf_{12}$ is the fall delay time of the second transmission transistor 12. The signal at the drain of the second transmission transistor 12 is equivalent to the signal at the input terminal of the inverter element 32.

Next, as indicated by the waveform [E], when a time $Tr_{32}$ elapses after the L-level signal is input to the input terminal, the inverter element 32 outputs the H-level signal to the input terminal of the inverter element 31 in the second stage. The time $Tr_{32}$ is the fall delay time of the inverter element 32.

Then, the transition of the signal propagates sequentially up to the inverter element 32 in the final stage. Then, as indicated by the waveform [OUT], the inverter element 32 in the final stage outputs the L-level signal to the second input terminal of the NAND element 30.

Next, as indicated by the waveform [A.], when a time $Tr_{30}$ elapses after the H-level signal is input to the second input terminal, the NAND element 30 outputs the H-level signal to the input terminal of the inverter element 31. The time $Tr_{30}$ is the rise delay time of the NAND element 30.

Next, as indicated by the waveform [E], when a time $Tf_{31}$ elapses after the H-level signal is input to the input terminal, the inverter element 31 outputs the L-level signal to the gate of the second pull-down transistor 16, to the gate of the pull-up element 20, etc. The time $Tf_{31}$ is the fall delay time of the inverter element 31.

Next, as indicated by the waveform [D], when a time $Tr_{20}$ elapses after the L-level signal is input to the gate, the pull-up element 20 enters the on state and the source of the pull-up element 20 turns to the H level. The time $Tr_{20}$ is the rise delay time of the pull-up element 20.

When the source of the pull-up element 20 turns to the H level, the drain of the second transmission transistor 12 and the input terminal of the inverter element 31 turn to the H level.

Next, as indicated by the waveform [E], when a time $Tr_{32}$ elapses after the L-level signal is input to the input terminal, the inverter element 32 outputs the H-level signal to the input terminal of the inverter element 31 in the second stage. The time $Tr_{32}$ is the rise delay time of the inverter element 32.

Then, the propagation reaches the inverter element 32 in the final stage and as indicated by the waveform [OUT], the inverter element 32 in the final stage outputs the H-level signal to the second input terminal of the NAND element 30. A time $Tc_2$ is the oscillation period of the ring oscillator 9.

The operation of the components of the ring oscillator 9 in the oscillation state is explained.

In the ring oscillator 9, the inverter elements 31 and 32 are inserted between the SRAM cell 10 and the pull-up element 20 connected in parallel, and therefore, in the oscillation period of the ring oscillator 9, the delay values of the inverter elements 31 and 32 are included. Thus, in order to evaluate the delay values of the second transmission transistor 12 and the second pull-down transistor 16 by using the ring oscillator 9, a ring oscillator for measuring the delay values of the inverter elements 31 and 32 is prepared separately.

To the drain of the second pull-down transistor 16, the input terminal of the inverter element 32 is connected via the second transmission transistor 12. As described above, the internal elements of the SRAM cell 10 and the inverter element 32 are laid out based on different wiring rules. Thus, in the ring oscillator 9, when the signal to be applied to the wire W starts transition to rise, the second pull-down transistor 16 is driven with the inverter element 32 as a load, and therefore, is affected by the elements laid out based on different wiring rules.

As described above, the ring oscillator 9 has a problem resulting from the inclusion of the inverter elements 31 and 32. Hereinafter, ring oscillators according to embodiments are explained with reference to FIGS. 3 to 21.

First, an example of a ring oscillator is explained with reference to FIGS. 3 to 5.

Figure 3:
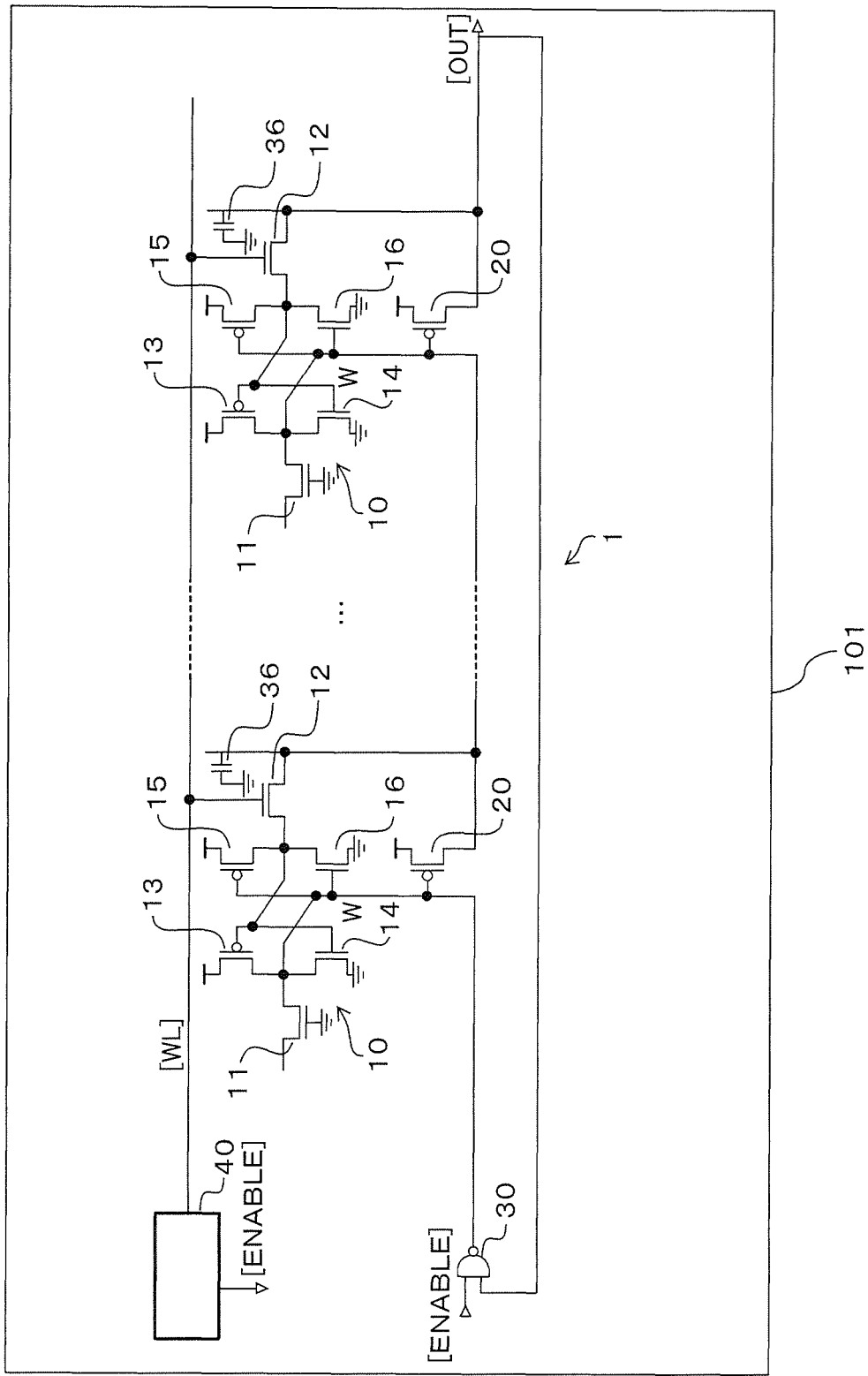
FIG. 3 is a diagram illustrating one aspect of ring oscillator.

FIG. 3 is a diagram illustrating a ring oscillator 1.

The ring oscillator 1 differs from the ring oscillator 9 explained with reference to FIGS. 1 and 2 in not having the inverter elements 31 and 32. The ring oscillator 1 includes the SRAMs 10 and the pull-up elements 20, respectively, in an even number of stages.

Figure 4:
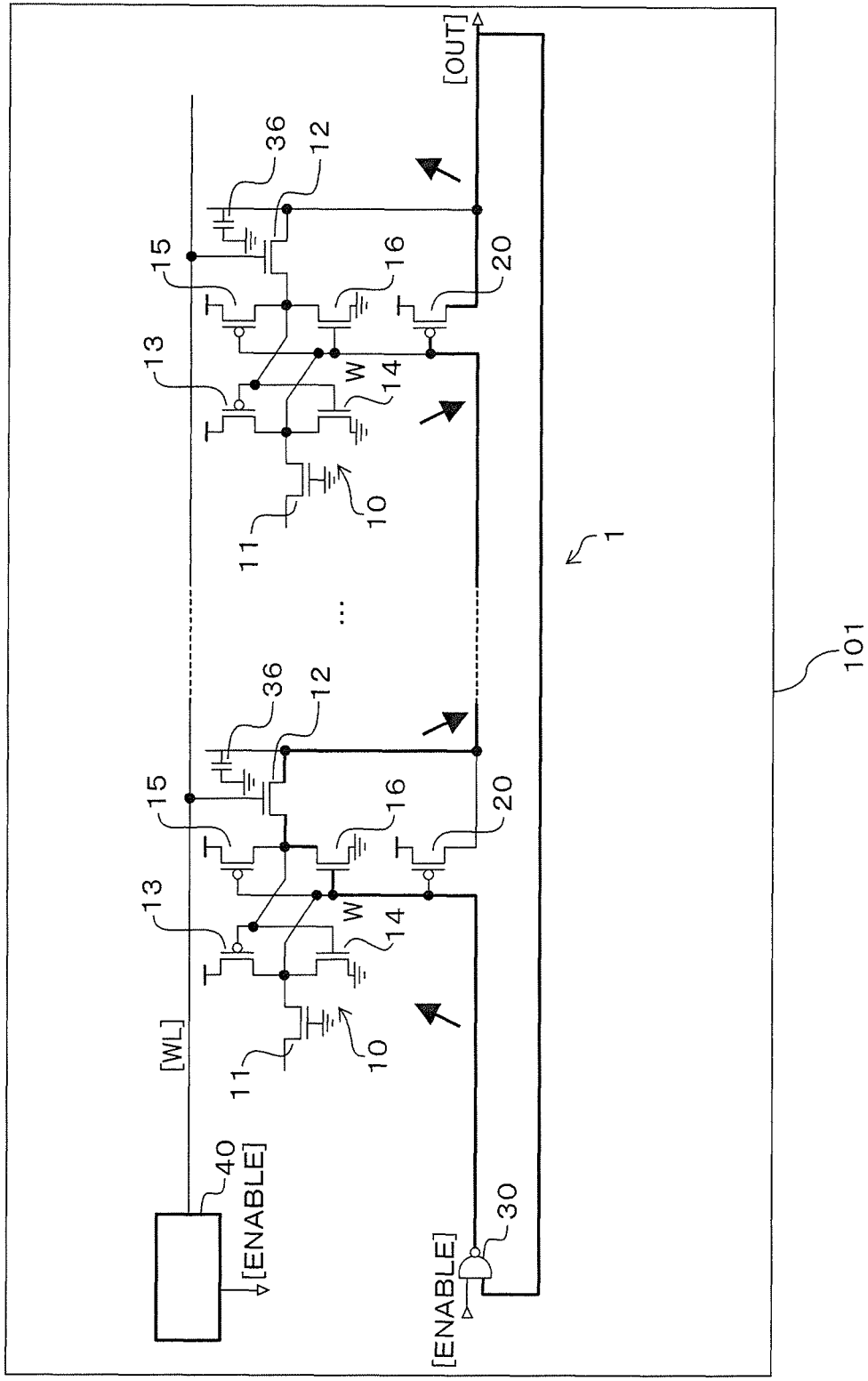
FIG. 4 is a diagram illustrating one operation of the ring oscillator described in FIG. 3.

FIG. 4 is a diagram illustrating a flow of a signal to be applied to the wire W connected to the SRAM cell 10 in the initial stage of the ring oscillator 1 when the signal transits to rise. In FIG. 4, the thick line indicates the flow of the signal when the signal to be applied to the wire W connected to the SRAM cell 10 in the initial stage of the ring oscillator 1 transits to rise.

When the signal to be applied to the wire W connected to the SRAM cell 10 in the initial stage of the ring oscillator 1 transits to rise, in an odd-numbered stage, the second transmission transistor 12 and the second pull-down transistor 16 inside the SRAM cell 10 function as delay elements. Further, in an even-numbered stage, the pull-up element 20 functions as a delay element. A rise signal output from the pull-up element 20 in the final stage of the ring oscillator 1 outputs a fall signal to the wire W connected to the SRAM cell 10 in the initial stage via the NAND element 30.

Figure 5:
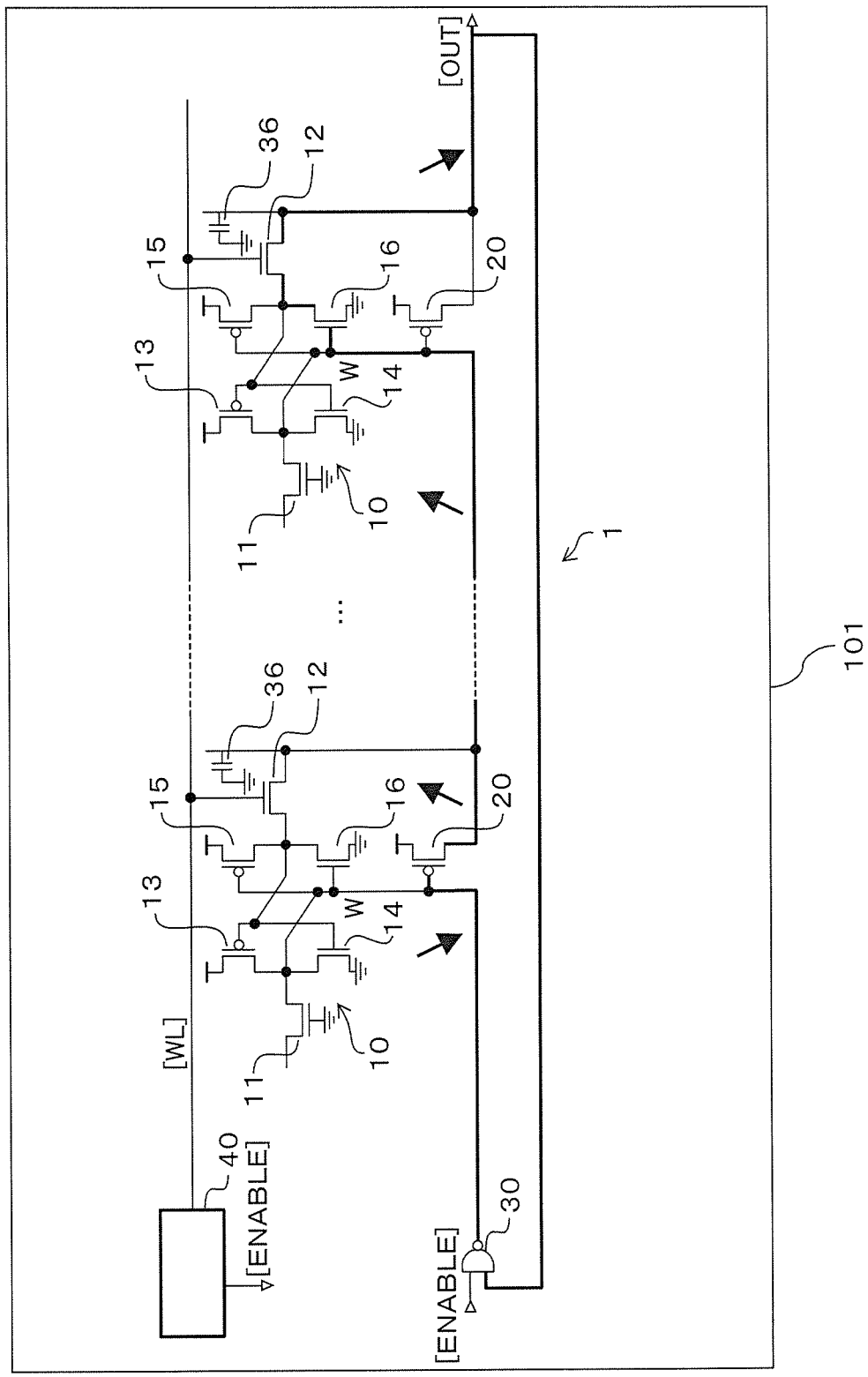
FIG. 5 is a diagram illustrating other operation of the ring oscillator described in FIG. 3.

FIG. 5 is a diagram illustrating a flow of a signal to be applied to the wire W connected to the SRAM cell 10 in the initial stage of the ring oscillator 1 when the signal transits to fall. In FIG. 5, the thick line indicates the flow of the signal to be applied to the wire W connected to the SRAM cell 10 in the initial stage of the ring oscillator 1 when the signal transits to fall.

When the signal to be applied to the wire W connected to the SRAM cell 10 in the initial stage of the ring oscillator 1 transits to fall, in an odd-numbered stage, the pull-up element 20 functions as a delay element. In an even-numbered stage, the second transmission transistor 12 and the second pull-down transistor 16 inside the SRAM cell 10 function as delay elements. A fall signal output from the second transmission transistor 12 and the second pull-down transistor 16 inside the SRAM cell 10 of the ring oscillator 1 outputs a rise signal to the wire W connected to the SRAM cell 10 in the initial stage via the NAND element 30.

Since the ring oscillator 1 includes no inverter element, the oscillation period of the ring oscillator 1 depends mostly on the fall delay value of the second pull-down transistor 16 and the rise delay value of the pull-up element 20. Thus, by designing layout so that the driving capability of the pull-up element 20 is much greater than the driving capability of the second pull-down transistor 16, the oscillation period of the ring oscillator 1 almost depends on the fall delay value of the second pull-down transistor 16.

In the ring oscillator 1, to the drain of the second transmission transistor 12, the drain of the first pull-up transistor 13 of the SRAM cell 10 in the next stage is connected. When a signal to be applied to the wire W starts transition to fall, the second pull-down transistor 16 and the first pull-up transistor 13 of the SRAM cell 10 in the next stage are turned on at the same time. Thus, the second pull-down transistor 16 and the first pull-up transistor 13 of the SRAM cell 10 in the next stage pull each other, resulting in an increase in the delay value when the signal to be applied to the wire W transits to fall. For example, in the case where the manufacturing conditions of the nMOS transistor are the slow conditions and the manufacturing conditions of the pMOS transistor are the fast conditions, the fall delay values of the second transmission transistor 12 and the second pull-down transistor 16, which are delay elements, become large.

Next, another example of the ring oscillator is explained with reference to FIGS. 6 to 8.

Figure 6:
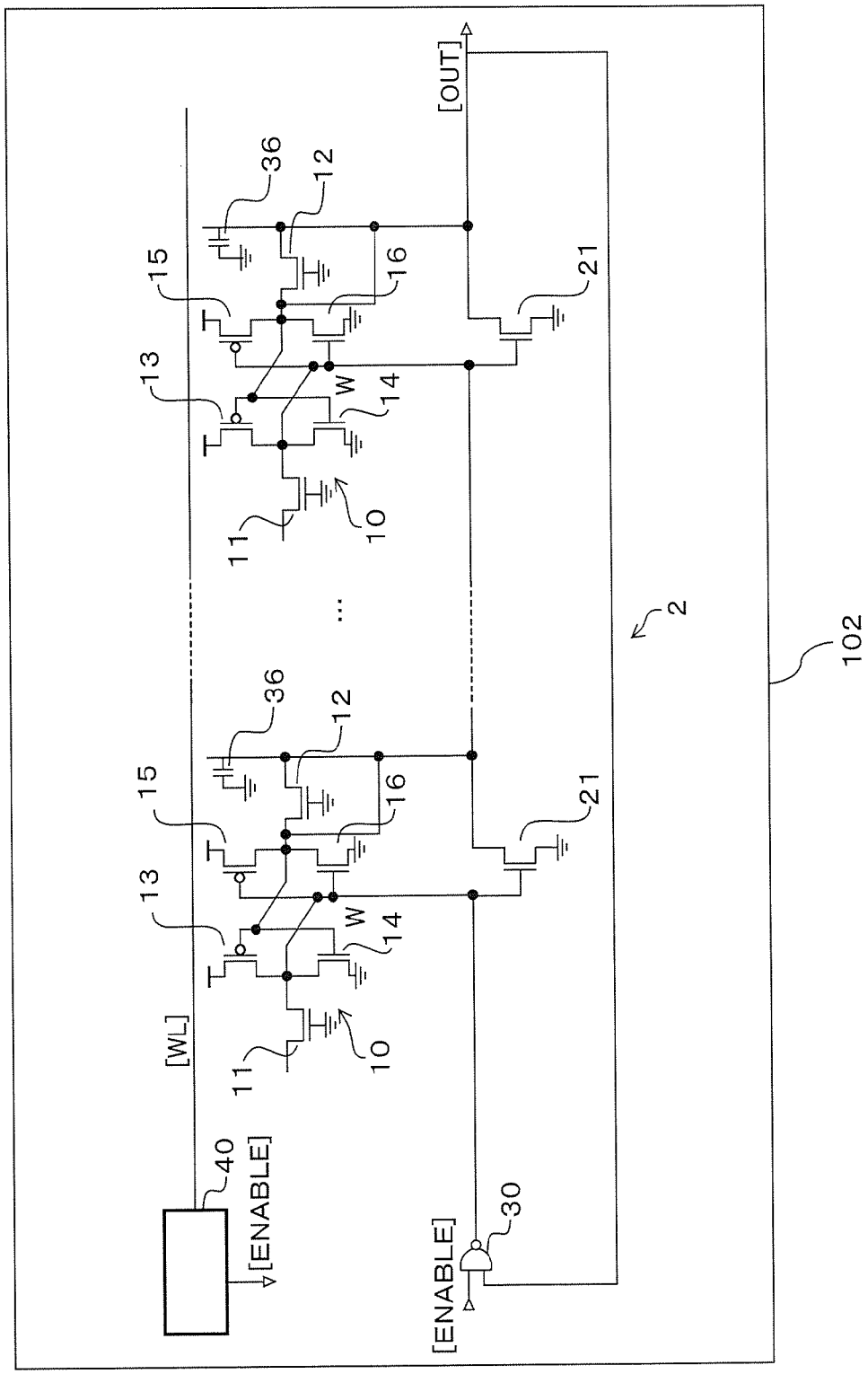
FIG. 6 is a diagram illustrating other aspect of ring oscillator.

FIG. 6 is a diagram illustrating a ring oscillator 2.

The ring oscillator 2 differs from the ring oscillator 1 explained with reference to FIGS. 3 to 5 in including a pull-down element 21 in place of the pull-up element 20. The ring oscillator 2 further differs from the ring oscillator 1 explained with reference to FIGS. 3 to 5 in that the source and drain of the second transmission transistor 12 are short-circuited.

Figure 7:
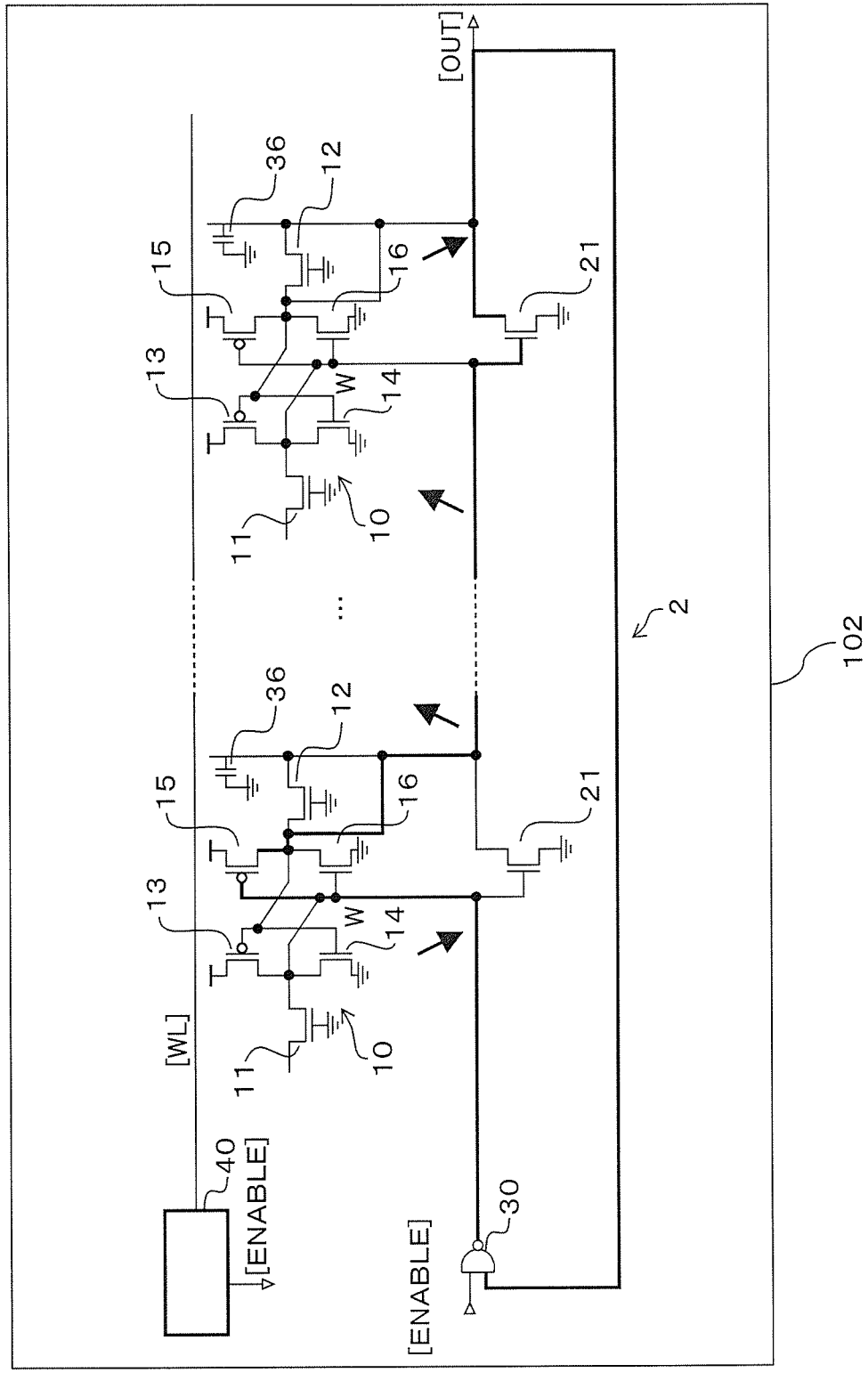
FIG. 7 is a diagram illustrating one operation of the ring oscillator described in FIG. 6.

FIG. 7 is a diagram illustrating a flow of a signal to be applied to the wire W connected to the SRAM cell 10 in the initial stage of the ring oscillator 2 when the signal transits to fall. In FIG. 7, the thick line indicates the flow of the signal when the signal to be applied to the wire W connected to the SRAM cell 10 in the initial stage of the ring oscillator 2 transits to fall.

When the signal applied to the wire W connected to the SRAM cell 10 in the initial stage of the ring oscillator 2 starts to fall, in an odd-numbered stage, the second pull-up transistor 15 inside the SRAM cell 10 functions as a delay element. In an even-numbered stage, the pull-down element 21 functions as a delay element. A fall signal output from the pull-down element 21 in the final stage of the ring oscillator 2 outputs a rise signal to the wire W connected to the SRAM cell 10 in the initial stage via the NAND element 30.

Figure 8:
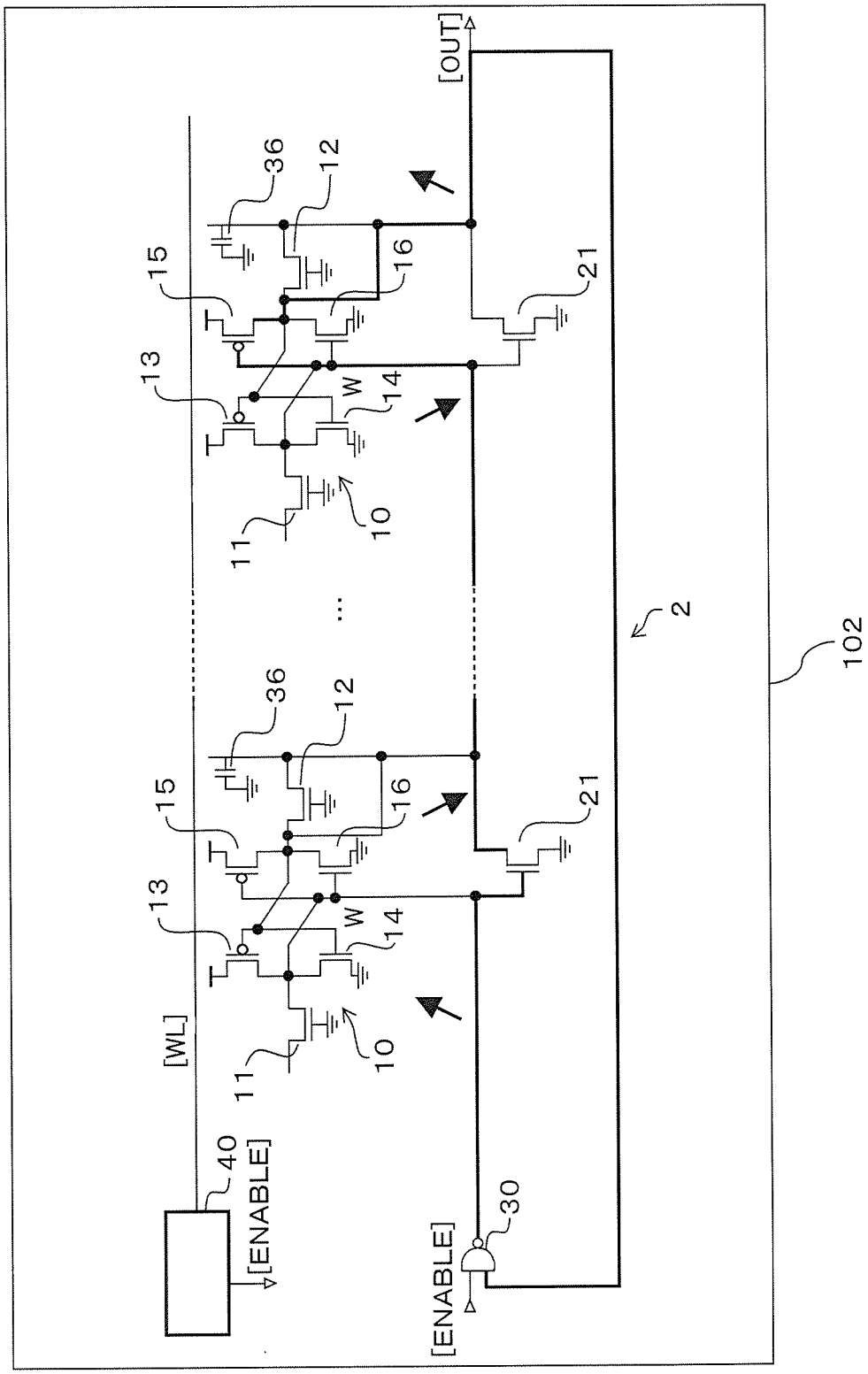
FIG. 8 is a diagram illustrating other operation of the ring oscillator described in FIG. 6.

FIG. 8 is a diagram illustrating a flow of a signal to be applied to the wire W connected to the SRAM cell 10 in the initial stage of the ring oscillator 2 when the signal transits to rise. In FIG. 8, the thick line indicates the flow of the signal when the signal to be applied to the wire W connected to the SRAM cell 10 in the initial stage of the ring oscillator 2 transits to rise.

When the signal to be applied to the wire W connected to the SRAM cell 10 in the initial stage of the ring oscillator 2 transits to rise, in an odd-numbered stage, the pull-down element 21 functions as a delay element. In an even-numbered stage, the second pull-up transistor 15 inside the SRAM cell 10 functions as a delay element. A rise signal output from the second pull-up transistor 15 inside the SRAM cell 10 of the ring oscillator 2 outputs a fall signal to the wire W connected to the SRAM cell 10 in the initial stage via the NAND element 30.

Since the ring oscillator 2 includes no inverter element, the oscillation period of the ring oscillator 2 depends mostly on the rise delay value of the second pull-up transistor 15 and the fall delay value of the pull-down element 21. Thus, by designing layout so that the driving capability of the pull-down element 21 is much greater than the driving capability of the second pull-up transistor 15, the oscillation period of the ring oscillator 2 almost depends on the rise delay value of the second pull-up transistor 15.

In the ring oscillator 2, to the drain of the second transmission transistor 12, the drain of the first pull-down transistor 14 of the SRAM cell 10 in the next stage is connected. When a signal applied to the wire W starts to rise, the second pull-up transistor 15 and the first pull-down transistor 14 of the SRAM cell 10 in the next stage are turned on at the same time. Thus, the second pull-up transistor 15 and the first pull-down transistor 14 of the SRAM cell 10 in the next stage pull each other, resulting in an increase in the delay value when the signal to be applied to the wire W transits to rise.

Next, another example of the ring oscillator is explained with reference to FIGS. 9 to 12.

FIG. 9 is a diagram illustrating a ring oscillator 3

The ring oscillator 3 has the second transmission transistors 12 and the second pull-down transistors 16 in an odd number of stages that function as delay elements, and the pull-up elements 20 in an odd number of stages, the control unit 40, and an oscillation control unit 50.

In the ring oscillator 3, in place of the SRAM cell 10, the second transmission transistor 12 and the second pull-down transistor 16 formed in a layout region having the same layout shape as the layout shape of the SRAM cell are laid out. A cell 10*a* including the second transmission transistor 12 and the second pull-down transistor 16 is formed in the same layout region as that of the SRAM cell 10. However, in the cell 10*a*, the drain of the first pull-down transistor 14 is connected neither to the drain of the first pull-up transistor 13 nor to the wire W to which the second pull-up transistor 15 and the second pull-down transistor 16 are connected. In other words, the cell 10*a* to be mounted on a semiconductor element 102 differs from the previously-explained SRAM cell 10 in that the drain of the first pull-down transistor 14 is not connected to the wire W.

The ring oscillator 3 further differs from the ring oscillator 1 explained with reference to FIGS. 3 to 5 in that the oscillation control unit 50 is laid out in place of the NAND element 30. The oscillation control unit 50 has a transmission unit 51, an inverter element 52, and a pull-down transistor 53. In the oscillation control unit 50, when the enable signal ENABLE is the H-level signal, the transmission unit 51 opens and the output terminal OUT and the wire W are brought into the conduction state, and when the enable signal ENABLE is the L-level signal, the L-level signal is applied to the wire W.

The ring oscillator 3 further differs from the previously-explained ring oscillator 1 in that a plurality of second transmission transistors 12 and a plurality of second pull-down transistors 16, which are delay elements, are connected in parallel. The drains of the second transmission transistors 12 of a plurality of cells 10*a* laid out in the longitudinal direction are connected to one another, and the gates of the second pull-down transistors 16 are connected to one another. Thus, a plurality of second transmission transistors 12 and a plurality of second pull-down transistors 16, which are delay elements, are connected in parallel.

Figure 10A:
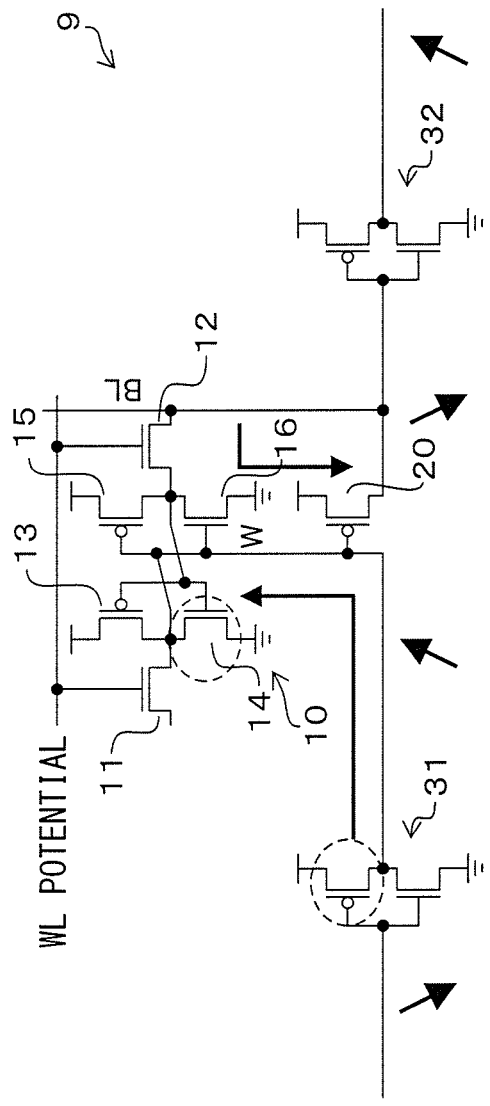
FIG. 10A is a diagram illustrating the operation of the ring oscillator described in FIG. 1.
Figure 10B:
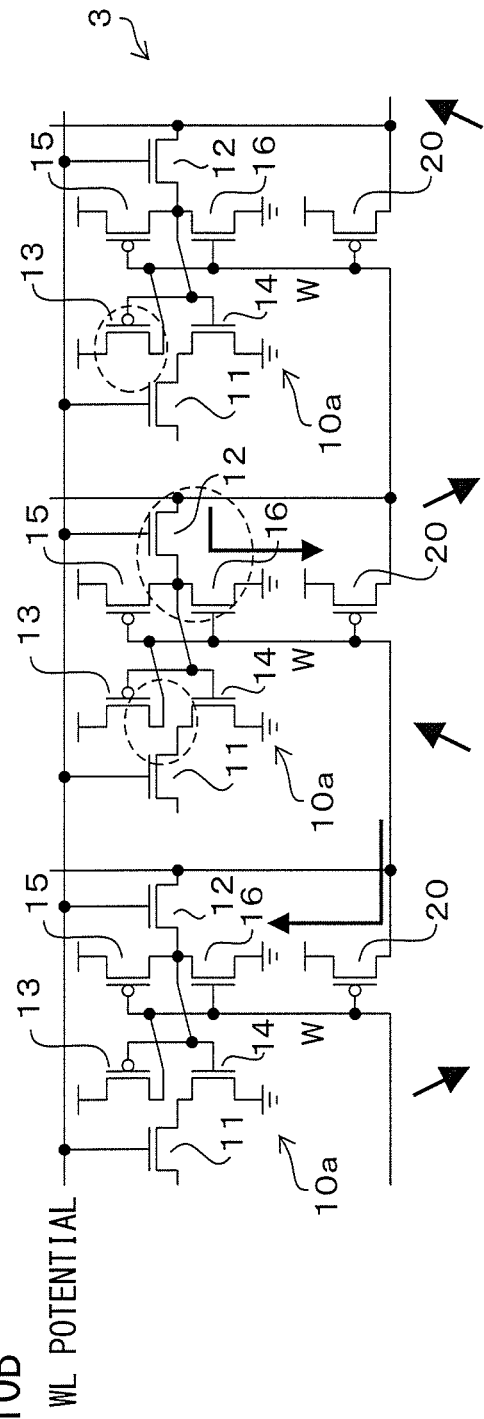
FIG. 10B is a diagram illustrating the operation of the ring oscillator described in FIG. 9.

FIG. 10A is a diagram illustrating the operation of the ring oscillator 9, which is a modified circuit of the ring oscillator 1 illustrated in FIG. 1, and FIG. 10B is a diagram illustrating the operation of the ring oscillator 3 illustrated in FIG. 9.

In the ring oscillator 9, to the wire W connecting the output of the inverter element 32 and the SRAM cell 10, the first pull-down transistor 14 is connected. Thus, when the signal input to the inverter element 32 starts to fall and the signal applied to the wire W starts to rise, the pMOS transistor of the inverter element 32 and the first pull-down transistor 14 turn on at the same time. Thus, the pMOS transistor of the inverter element 32 and the first pull-down transistor 14 pull each other, resulting in an increase in the delay value when the inverter element 32 transits to rise. In particular, when the manufacturing conditions of the pMOS transistor are the slow conditions and those of the nMOS transistor are the fast conditions, the delay value when the inverter element 32 transits to rise becomes large. When the manufacturing conditions of the pMOS transistor are the fast conditions and those of the nMOS transistor are the slow conditions, the delay value when the inverter element 32 starts to rise becomes comparatively small.

On the other hand, in the ring oscillator 3, to the wire W connecting the drain of the pull-up element 20 and the second pull-down transistor 16, the first pull-down transistor 14 is not connected. When the signal to be input to the gate of the pull-up element 20 transits to fall and the signal to be applied to the wire W starts transition to rise, there is no influence of the first pull-down transistor 14, and therefore, it is possible for the pull-up element 20 to reduce the rise delay value.

In the ring oscillator 3, the rise delay value of the pull-up element 20 becomes small and the delay values of the second pull-down transistor 16 and the second transmission transistor 12 become large. Thus, it is possible to increase the ratio that the delay values of the second pull-down transistor 16 and the second transmission transistor 12 account for in the oscillation period of the ring oscillator 3.

In the ring oscillator 3, even when the manufacturing conditions of the pMOS transistor are the slow conditions and those of the nMOS transistor are the fast conditions, it is possible to sufficiently reflect the transistor characteristics in the oscillation frequency. Further, in the ring oscillator 3, even when the manufacturing conditions of the pMOS transistor are the fast conditions and those of the nMOS transistor are the slow conditions, it is possible to sufficiently reflect the transistor characteristics in the oscillation frequency.

The ring oscillator 3 includes neither the NAND element 30 nor the inverter elements 31 and 32. Thus, the oscillation period of the ring oscillator 3 depends on the delay values of the second transmission transistor 12 and the second pull-down transistor 16 and on the delay value of the pull-up element 20 the delay value of which is small. In the oscillation period of the ring oscillator 3, the second transmission transistor 12 and the second pull-down transistor 16 become predominant, and therefore, it is possible to evaluate the delay characteristics of the SRAM cell with higher precision.

In the ring oscillator 3, a plurality of second transmission transistors 12 and a plurality of second pull-down transistors 16 formed in a layout region having the same layout shape as the layout shape of the SRAM cell are connected in parallel. Since the ring oscillator 3 has the plurality of second transmission transistors 12 and the plurality of second pull-down transistors 16 connected in parallel, it is possible to increase the number of transistors to be evaluated. By increasing the number of transistors to be evaluated, the period of the ring oscillator 3 no longer depends on the variations in the characteristics of the individual transistors forming the second transmission transistor 12 and the second pull-down transistor 16. Thus, the period of the ring oscillator 3 does not depend largely on the variations in the characteristics of the individual transistors, and therefore, it is possible to more accurately evaluate the manufacturing conditions of a wafer in which the ring oscillator 3 is formed.

Figure 11A:
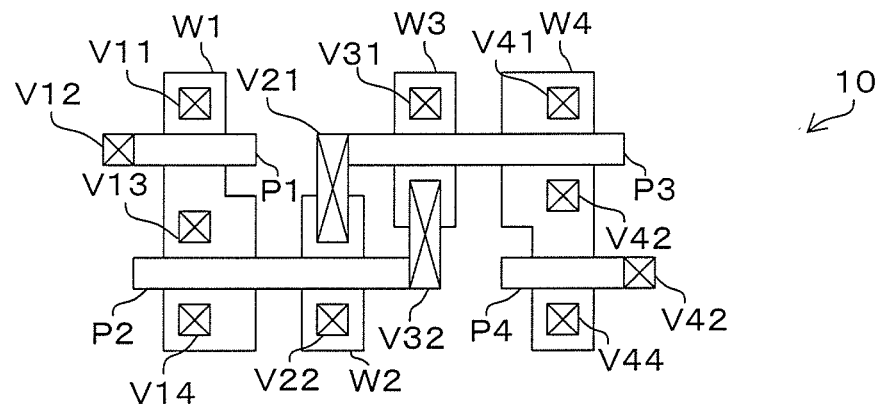
FIG. 11A is a layout diagram of a SRAM cell to be mounted on the ring oscillator described in FIG. 1.
Figure 11B:
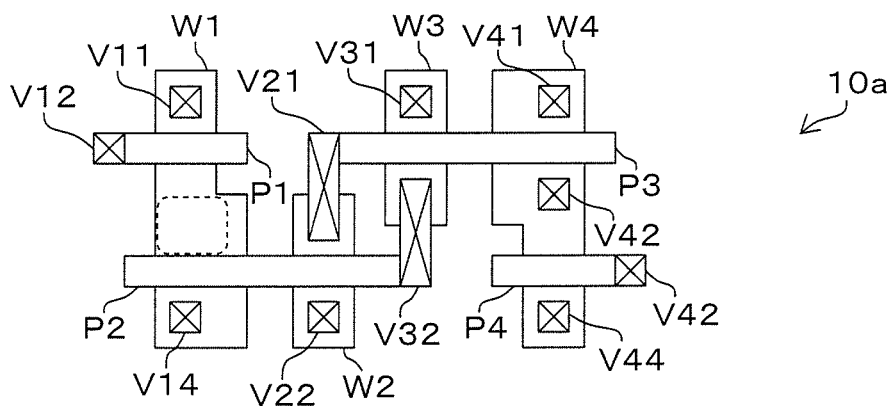
FIG. 11B is a layout diagram of one SRAM cell to be mounted on the ring oscillator described in FIG. 9.

FIG. 11A is a layout diagram of the SRAM cell 10 to be mounted on the ring oscillator 1, and FIG. 11B is a layout diagram of the cell 10*a* to be mounted on the ring oscillator 3.

The SRAM cell 10 has wells W1 to W4, polysilicon P1 to P4, and vias V11 to V14, V21, V22, V31, V32, and V41 to V44. The cell 10*a* differs from the SRAM cell 10 in not having the via V13.

The difference between the SRAM cell 10 and the cell 10*a* lies only in the possession of the via V13, and therefore, it is possible to easily form the cell 10*a* from the SRAM cell 10. Further, the layout structure of the cell 10*a* is the same as the layout structure of the SRAM cell 10 except for the via V13, and therefore, the delay characteristics of the transistor forming the cell 10*a* are substantially equal to the delay characteristics of the SRAM cell 10.

Figure 12:
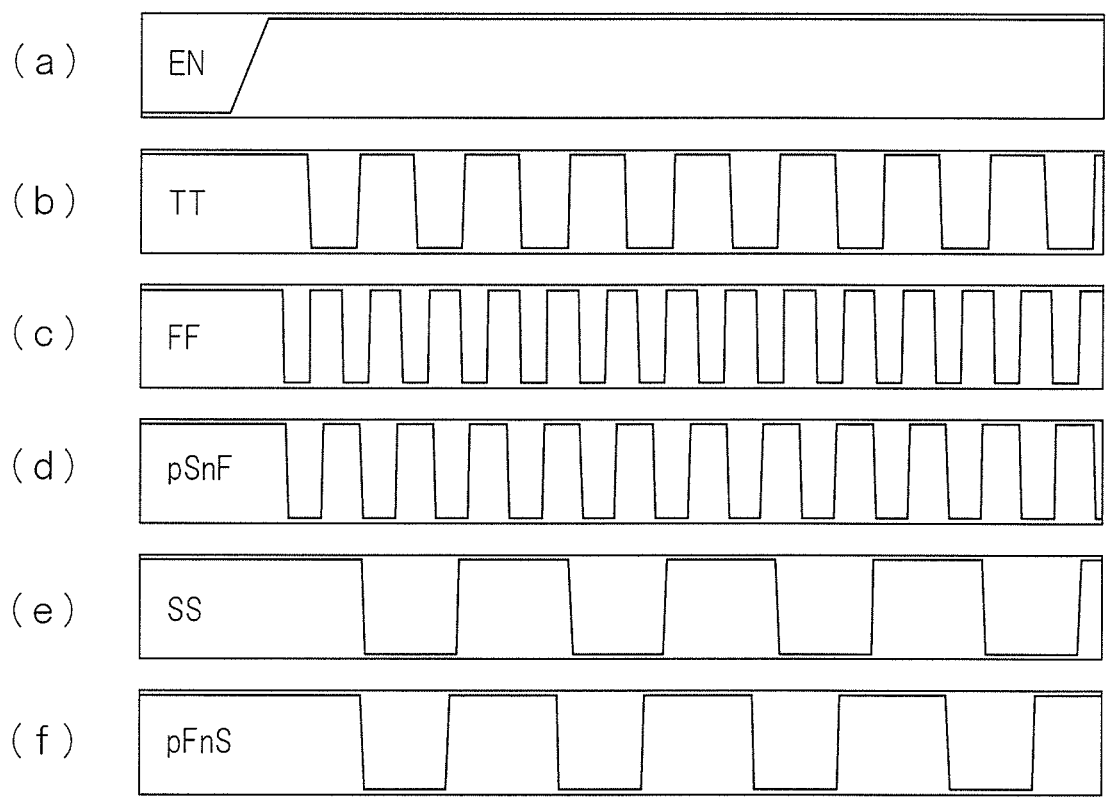
FIG. 12 is a diagram illustrating simulation waveforms of the ring oscillator described in FIG. 9.

FIG. 12 is a diagram illustrating simulation waveforms of the ring oscillator 3. Wave (a) of FIG. 12 is a waveform of the enable signal ENABLE and wave (a) of FIG. 12 is a waveform of the output signal OUT in the case where the manufacturing conditions of both the nMOS transistor and the pMOS transistor are the typical conditions. Wave (c) of FIG. 12 is a waveform of the output signal OUT in the case where the manufacturing conditions of both the nMOS transistor and the pMOS transistor are the fast conditions. Wave (d) of FIG. 12 is a waveform of the output signal OUT in the case where the manufacturing conditions of the nMOS transistor are the fast conditions and the manufacturing conditions of the pMOS transistor are the slow conditions. Wave (e) of FIG. 12 is a waveform of the output signal OUT in the case where the manufacturing conditions of both the nMOS transistor and the pMOS transistor are the slow conditions. Wave (f) of FIG. 12 is a waveform of the output signal OUT in the case where the manufacturing conditions of the nMOS transistor are the slow conditions and the manufacturing conditions of the pMOS transistor are the fast conditions.

As illustrated in FIG. 12, the ring oscillator 3 oscillates in the period in accordance with the manufacturing conditions of the transistor, and therefore, it is possible to evaluate with high precision the delay characteristics of the SRAM cell by the manufacturing conditions of the transistor by analyzing the oscillation period of the ring oscillator 3. It is possible to evaluate the delay characteristics of the write operation of the SRAM cell 10 by evaluating the delay values of the second transmission transistor 12 and the second pull-down transistor 16.

Next, another example of the ring oscillator is explained with reference to FIGS. 13 to 15.

FIG. 13 is a diagram illustrating a ring oscillator 4.

The ring oscillator 4 differs from the previously-explained ring oscillator 3 in that the element that functions as a delay element is the second pull-up transistor 15, not the second transmission transistor 12 or the second pull-down transistor 16. The ring oscillator 4 further differs from the previously-explained ring oscillator 3 in that the pull-down element 21 is laid out in place of the pull-up element 20.

A cell 10*b* including the second pull-up transistor 15 that functions as a delay element of the ring oscillator 4 is formed in the same layout region as that of the SRAM cell 10. However, in the cell 10*b*, the source of the first pull-up transistor 13 is not connected to the power source voltage but opened. Further, in the cell 10*b*, the source and the drain of the second transmission transistor 12 are short-circuited.

Figure 14A:
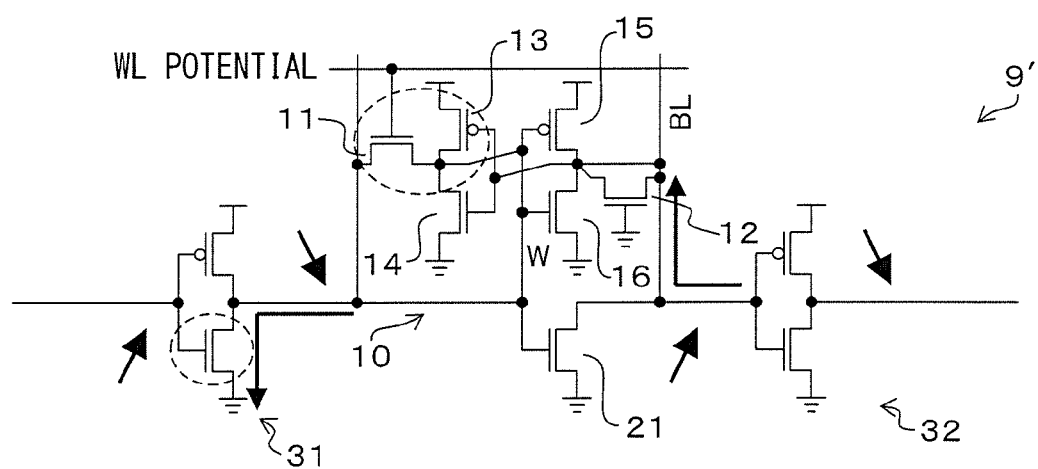
FIG. 14A is a layout diagram of a SRAM cell to be mounted on the ring oscillator described in FIG. 1.
Figure 14B:
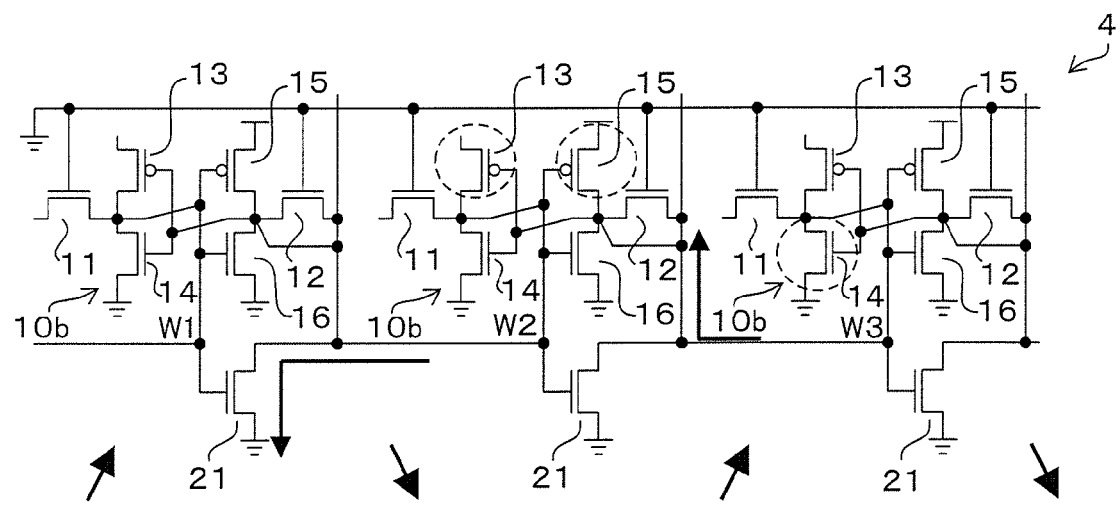
FIG. 14B is a layout diagram of a SRAM cell to be mounted on the ring oscillator described in FIG. 13.

FIG. 14A is a diagram illustrating the operation of a ring oscillator 9', which is a modified circuit of the ring oscillator 9 illustrated in FIG. 1, and FIG. 14B is a diagram illustrating the operation of the ring oscillator 4 illustrated in FIG. 7.

The ring oscillator 9' differs from the ring oscillator 9 in that the pull-down element 21 is laid out in place of the pull-up element 20. In the ring oscillator 9', to the wire W connecting the output of the inverter element 31 and the SRAM cell 10, the first pull-up transistor 13 is connected. Thus, when the signal to be input to the inverter element 31 transits to rise and the signal to be applied to the wire W starts transition to fall, the nMOS transistor of the inverter element 31 and the first pull-up transistor 13 turn on at the same time. Thus, the nMOS transistor of the inverter element 31 and the first pull-up transistor 13 pull each other, resulting in an increase in the delay value when the inverter element 31 transits to fall. In particular, in the case where the manufacturing conditions of the nMOS transistor are the slow conditions and those of the pMOS transistor are the fast conditions, the delay value when the inverter element 31 transits to fall becomes large. In the case where the manufacturing conditions of the nMOS transistor are the fast conditions and those of the pMOS transistor are the slow conditions, the delay value when the inverter element 31 starts to fall becomes comparatively small.

On the other hand, in the ring oscillator 4, the source of the first pull-up transistor 13 to be connected to the wire W connecting the drain of the pull-down element 21 and the second pull-up transistor 15 is opened. When the signal to be input to the gate of the pull-down element 21 transits to rise and the signal to be applied to the wire W starts to fall, there is no influence of the first pull-up transistor 13, and therefore, it is possible for the pull-down element 21 to reduce the fall delay value.

In the ring oscillator 4, the fall delay value of the pull-down element 21 becomes small and the delay value of the second pull-up transistor 15 becomes large. Thus, it is possible to increase the ratio that the delay value of the second pull-up transistor 15 accounts for in the oscillation period of the ring oscillator 4.

In the ring oscillator 4, even in the case where the manufacturing conditions of the nMOS transistor are the slow conditions and those of the pMOS transistor are the fast conditions, it is possible to sufficiently reflect the transistor characteristics in the oscillation frequency. Further, in the ring oscillator 4, even in the case where the manufacturing conditions of the nMOS transistor are the fast conditions and those of the pMOS transistor are the slow conditions, it is possible to sufficiently reflect the transistor characteristics in the oscillation frequency.

Figure 11C:
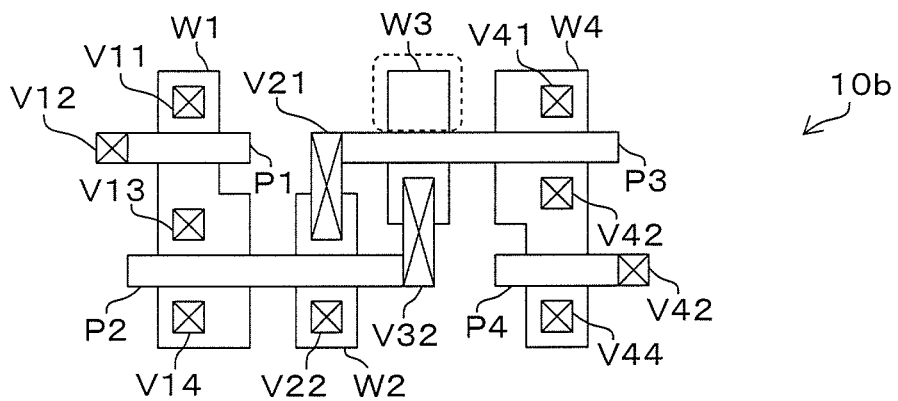
FIG. 11C is a layout diagram of other SRAM cell to be mounted on the ring oscillator described in FIG. 9.

FIG. 11C is a layout diagram of the cell 10*b* to be mounted on the ring oscillator 4.

The different point between the SRAM cell 10 illustrated in FIG. 11A and the cell 10*b* lies only in the possession of the via V 31, and therefore, it is possible to easily form the cell 10*b* from the SRAM cell 10. Further, the layout structure of the cell 10*b* is the same as the layout structure of the SRAM cell 10 except for the via V 31, and therefore, the delay characteristics of the transistor forming the cell 10*b* are substantially equal to the delay characteristics of the SRAM cell 10.

Figure 15:
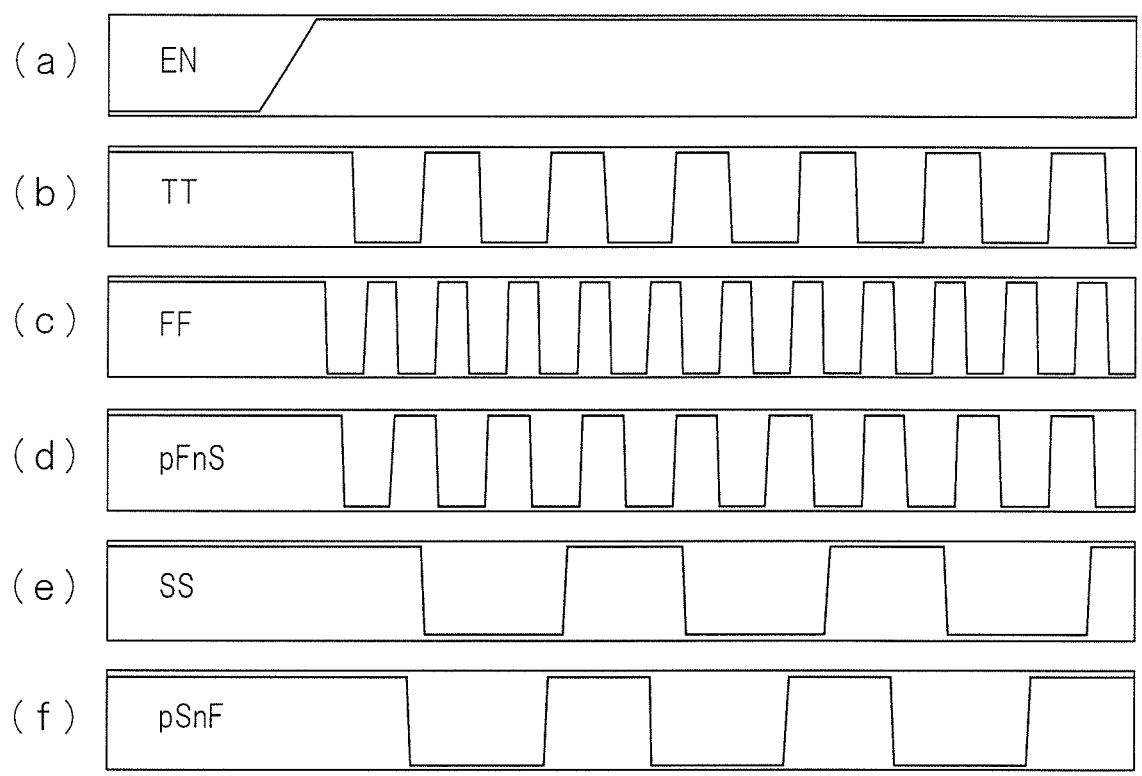
FIG. 15 is a diagram illustrating simulation waveforms of the ring oscillator described in FIG. 13.

FIG. 15 is a diagram illustrating simulation waveforms of the ring oscillator 4. Wave (a) of FIG. 15 is a waveform of the enable signal ENABLE and wave (b) of FIG. 15 is a waveform of the output signal OUT in the case where the manufacturing conditions of both the nMOS transistor and the pMOS transistor are the typical conditions. Wave (c) of FIG. 15 is a waveform of the output signal OUT in the case where the manufacturing conditions of both the nMOS transistor and the pMOS transistor are the fast conditions. Wave (d) of FIG. 15 is a waveform of the output signal OUT in the case where the manufacturing conditions of the nMOS transistor are the slow conditions and the manufacturing conditions of the pMOS transistor are the fast conditions. Wave (e) of FIG. 15 is a waveform of the output signal OUT in the case where the manufacturing conditions of both the nMOS transistor and the pMOS transistor are the slow conditions. Wave (f) of FIG. 15 is a waveform of the output signal OUT in the case where the manufacturing conditions of the nMOS transistor are the fast conditions and the manufacturing conditions of the pMOS transistor are the slow conditions.

As illustrated in FIG. 15, the ring oscillator 4 oscillates in the period in accordance with the manufacturing conditions of the transistor, and therefore, it is possible to evaluate with high precision the delay characteristics of the SRAM cell by the manufacturing conditions of the transistor by analyzing the oscillation period of the ring oscillator 4. It is possible to evaluate the delay characteristics of the pMOS transistor of the SRAM cell by evaluating the delay value of the second pull-up transistor 15.

Next, another example of the ring oscillator is explained with reference to FIGS. 16 and 17.

Figure 16:
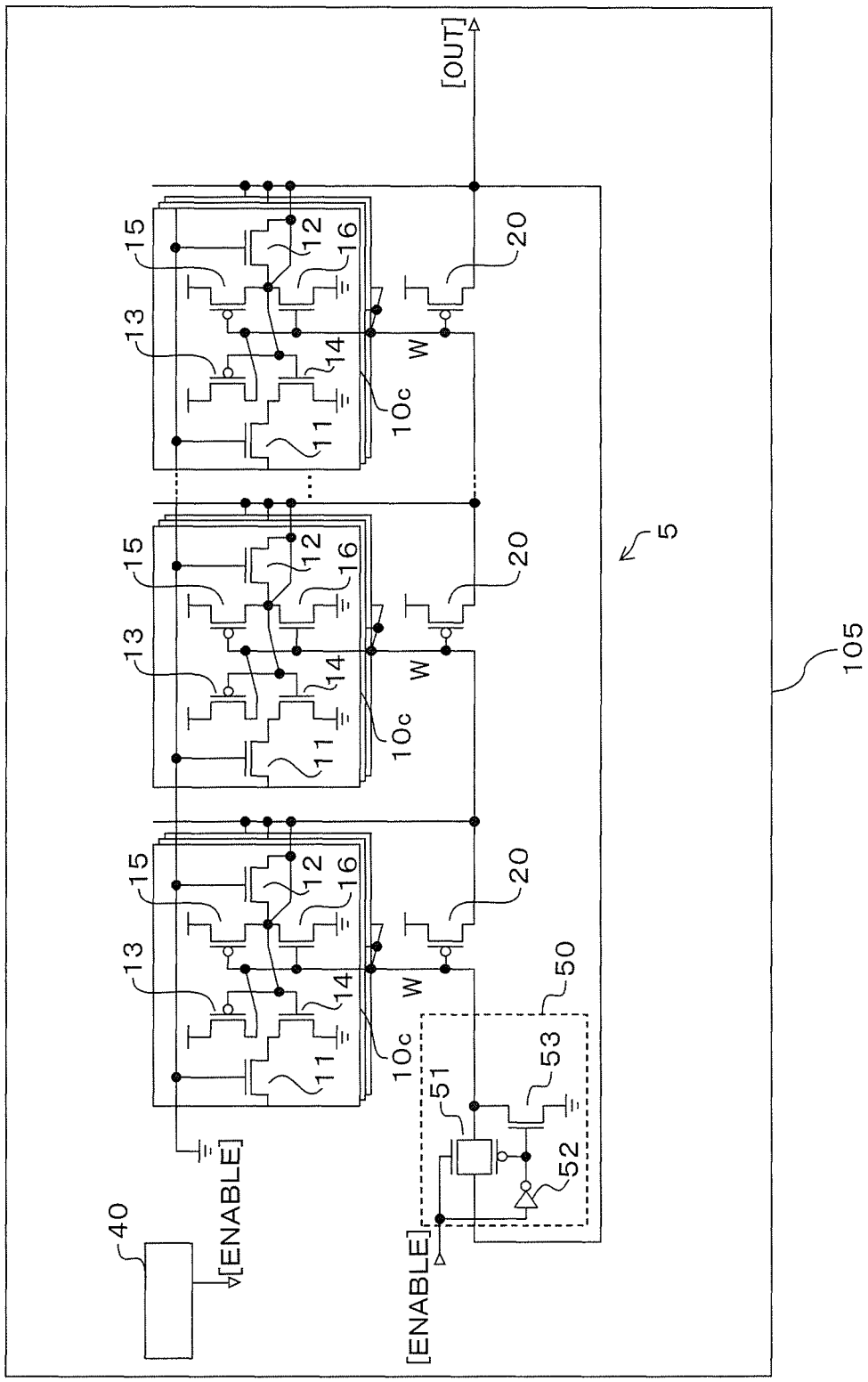
FIG. 16 is a diagram illustrating still other aspect of ring oscillator.

FIG. 16 is a diagram illustrating a ring oscillator 5.

The ring oscillator 5 differs from the previously-explained ring oscillator 3 in that the source and drain of the second transmission transistor 12 are short-circuited.

A cell 10c including the second pull-down transistor 16 that functions as a delay element of the ring oscillator 5 is formed in the same layout region as that of the SRAM cell 10. However, in the cell 10c, the drain of the first pull-down transistor 14 is not connected to the wire W. Further, in the cell 10c, the source and drain of the second transmission transistor 12 are short-circuited.

The layout shape of the cell 10c is the same as the shape of the cell 10a illustrated in FIG. 11A.

Figure 17:
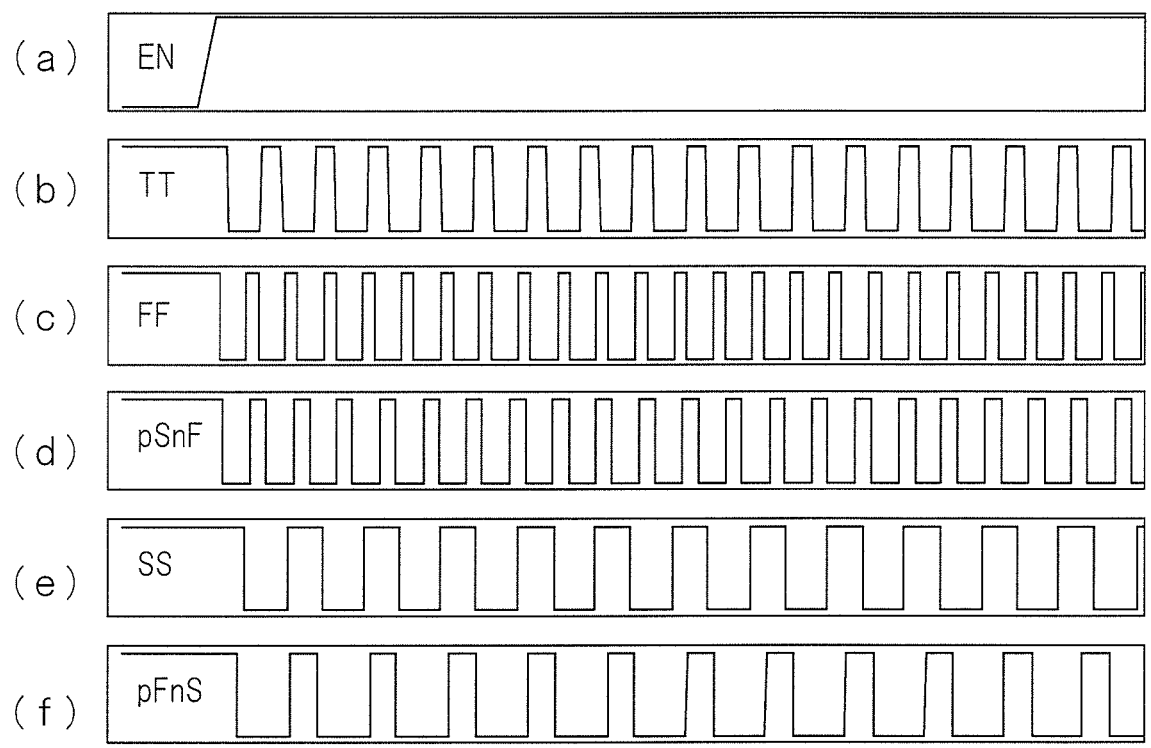
FIG. 17 is a diagram illustrating simulation waveforms of the ring oscillator described in FIG. 16.

FIG. 17 is a diagram illustrating simulation waveforms of the ring oscillator 5. Wave (a) of FIG. 17 is a waveform of the enable signal ENABLE and wave (b) of FIG. 17 is a waveform of the output signal OUT in the case where the manufacturing conditions of both the nMOS transistor and the pMOS transistor are the typical conditions. Wave (c) of FIG. 17 is a waveform of the output signal OUT in the case where the manufacturing conditions of both the nMOS transistor and the pMOS transistor are the fast conditions. Wave (d) of FIG. 17 is a waveform of the output signal OUT in the case where the manufacturing conditions of the nMOS transistor are the fast conditions and the manufacturing conditions of the pMOS transistor are the slow conditions. Wave (e) of FIG. 17 is a waveform of the output signal OUT in the case where the manufacturing conditions of both the nMOS transistor and the pMOS transistor are the slow conditions. Wave (f) of FIG. 17 is a waveform of the output signal OUT in the case where the manufacturing conditions of the nMOS transistor are the slow conditions and the manufacturing conditions of the pMOS transistor are the fast conditions.

Next, another example of the ring oscillator is explained with reference to FIGS. 18 to 20.

Figure 18:
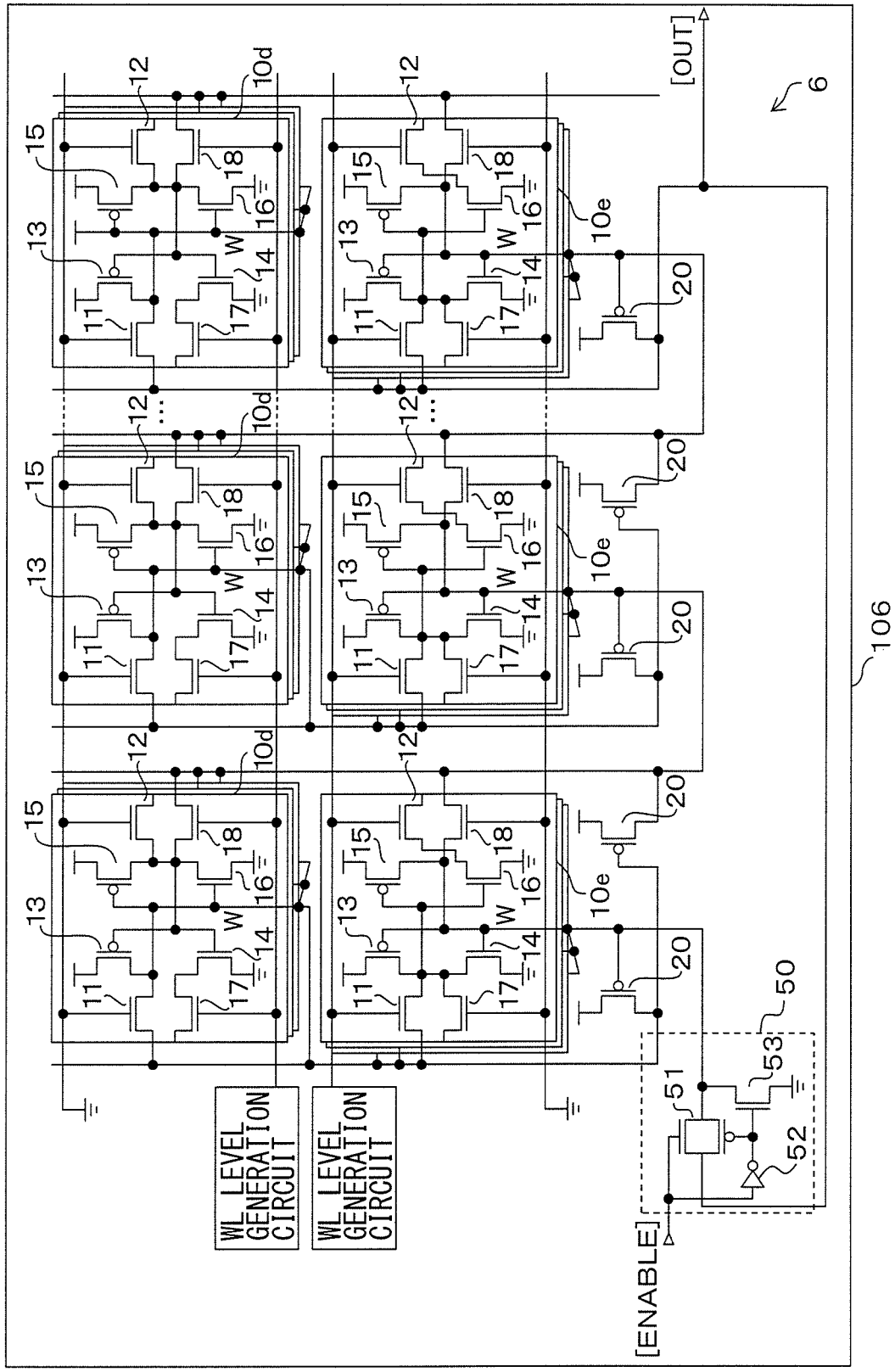
FIG. 18 is a diagram illustrating still other aspect of ring oscillator.

FIG. 18 is a diagram illustrating a ring oscillator 6.

The ring oscillator 6 differs from the previously-explained ring oscillator 3 in that elements formed in a layout region having the same layout shape as the layout shape of a 2RW SRAM cell are used as delay elements.

Figure 19A:
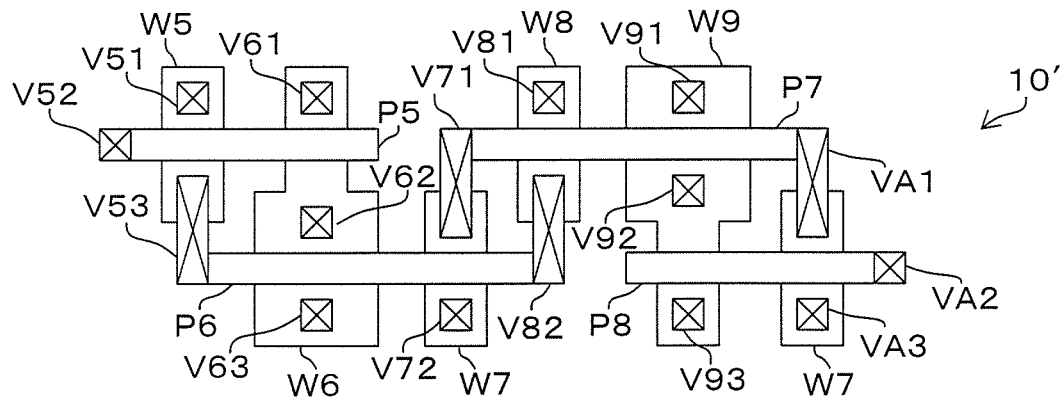
FIG. 19A is a layout diagram of a SRAM cell to be mounted on the ring oscillator described in FIG. 1.
Figure 19B:
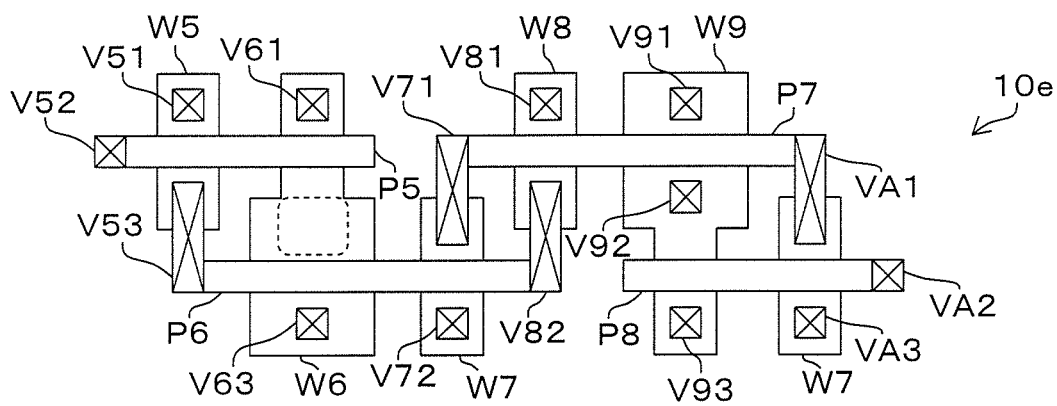
FIG. 19B is a layout diagram of one SRAM cell to be mounted on the ring oscillator described in FIG. 18.
Figure 19C:
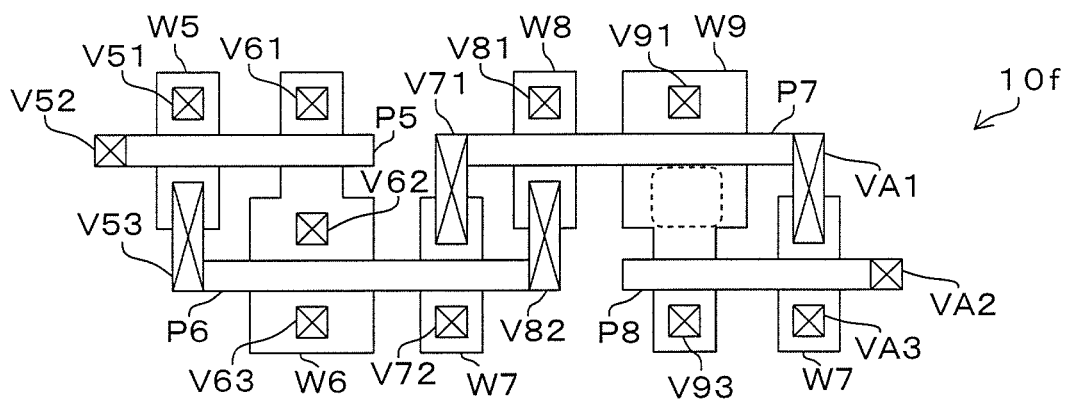
FIG. 19C is a layout diagram of other SRAM cell to be mounted on the ring oscillator described in FIG. 18.

FIG. 19A is a layout diagram of a 2RW SRAM cell 10', FIG. 19B is a layout diagram of a cell 10e to be mounted on the ring oscillator 6, and FIG. 19C is a layout diagram of a cell 10f to be mounted on the ring oscillator 6.

The 2RW SRAM cell 10' has wells W5 to W9 and WA, polysilicon P5 to P8, and vias V51 to V53, V61, V62, V71, V72, V81, V82, V91 to V 93, VA1, and VA2. The cell 10e differs from the SRAM cell 10' in not having the via V62. A cell 10f differs from the SRAM cell 10' in not having the via V92.

Figure 20:
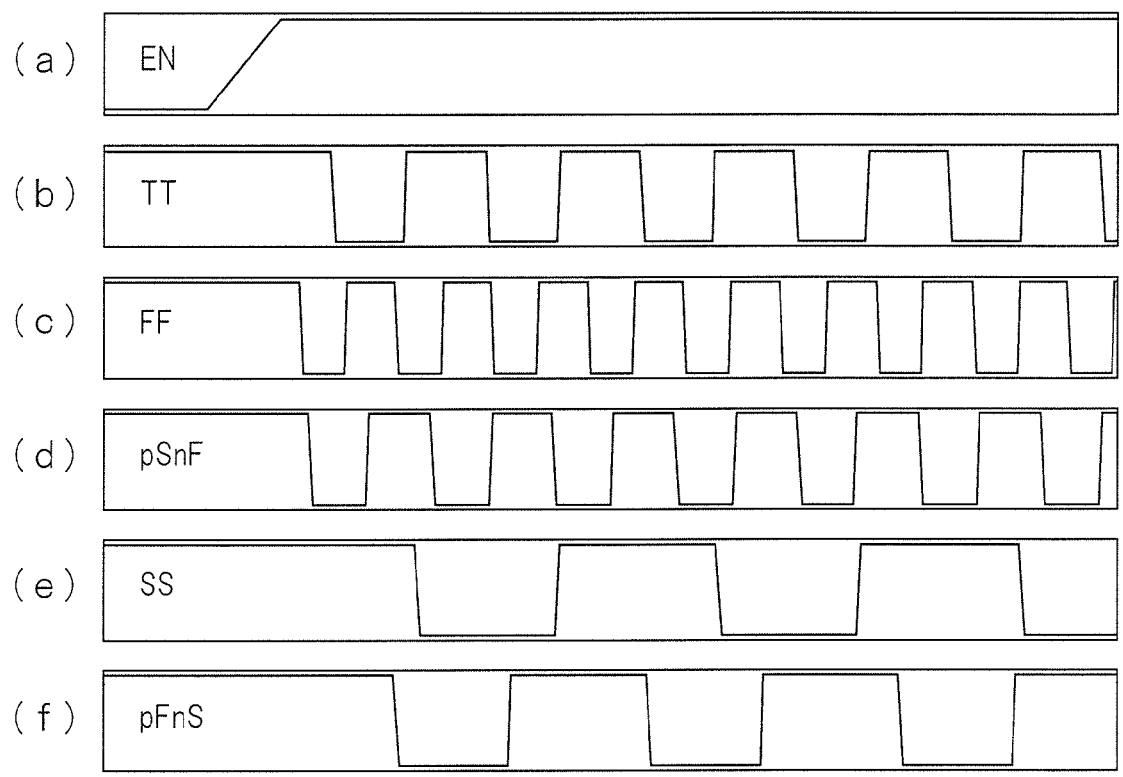
FIG. 20 is a diagram illustrating simulation waveforms of the ring oscillator described in FIG. 18.

FIG. 20 is a diagram illustrating simulation waveforms of the ring oscillator 6. Wave (a) of FIG. 20 is a waveform of the enable signal ENABLE and Wave (b) of FIG. 20 is a waveform of the output signal OUT in the case where the manufacturing conditions of both the nMOS transistor and the pMOS transistor are the typical conditions. Wave (c) of FIG. 20 is a waveform of the output signal OUT in the case where the manufacturing conditions of both the nMOS transistor and the pMOS transistor are the fast conditions. Wave (d) of FIG. 20 is a waveform of the output signal OUT in the case where the manufacturing conditions of the nMOS transistor are the fast conditions and the manufacturing conditions of the pMOS transistor are the slow conditions. Wave (e) of FIG. 20 is a waveform of the output signal OUT in the case where the manufacturing conditions of both the nMOS transistor and the pMOS transistor are the slow conditions. Wave (f) of FIG. 20 is a waveform of the output signal OUT in the case where the manufacturing conditions of the nMOS transistor are the slow conditions and the manufacturing conditions of the pMOS transistor are the fast conditions.

With the ring oscillator 6, it is possible to reduce the layout area by using the cells 10e and 10f having the same layout shape as the layout shape of the 2RW SRAM cell and by alternately operating the read ports.

Next, an example of the semiconductor device on which a plurality of ring oscillators is mounted is explained with reference to FIG. 21.

FIG. 21 is a diagram illustrating a semiconductor device 107 on which the ring oscillators 3 to 5 are mounted.

The semiconductor device 107 has the three ring oscillators 3 to 5, a logic circuit unit 110, and a memory circuit unit 120.

The logic circuit unit 110 has a plurality of logic circuits laid out based on the same layout wiring rules. The memory circuit unit 120 has an SRAM cell array 121 in which a plurality of SRAM cells 10 laid out based on the layout wiring rules whose intervals are narrower than the layout wiring rules of the logic circuits is laid out in the form of an array. In the SRAM cell array 121, it is possible to adjust the body potential of the N well, the body potential of the P well, and the potential of the word line from the outside of the semiconductor device 107.

The SRAM cells 10a to 10c of the ring oscillators 3 to 5 are laid out based on the same layout wiring rules as those of the SRAM cells 10 laid out in the SRAM cell array 121 of the memory circuit unit 120. The pull-up element 20 and the pull-down element 21 of the ring oscillators 3 to 5 are laid out based on the same layout wiring rules as those of the logic circuits of the logic circuit unit 110.

The semiconductor device 107 further has an output unit, not illustrated schematically, and it is possible to take out oscillation signals output from the OUT terminals of the ring oscillators 3 to 5 as output signals, respectively.

In the semiconductor device 107, it is possible to adjust the body potential of the N well, the body potential of the P well, and the potential of the word line based on the oscillation periods of the ring oscillators 3 to 5. For example, in the case where write characteristics are poor, adjustment is made so that the current of the transmission transistor is larger than the current of the pull-up transistor. In the case where the read speed is low in addition to the poor write characteristics, the body potentials of both the pull-up transistor and the pull-down transistor are made forward. On the other hand, in the case where the read speed is high, if the body potential of the nMOS transistor is made forward, the so-called stability margin is degraded and the retention characteristics are deteriorated. Thus, in the case where the read speed is high, the current of the transmission transistor is somewhat reduced conversely by adjusting the potential of the word line and at the same time, the current of the pull-up transistor is somewhat reduced by making the body potential of pMOS backward.

Hereinafter, other embodiments are explained.

The configuration of the embodiment is not limited to the configurations of the ring oscillators 1 to 5. For example, the ring oscillators 1 to 5 include no inverter elements, however, the ring oscillator may include a single or a plurality of inverter elements. Further, it may also be possible to lay out the NAND element 30 to be laid out in the ring oscillator 1 in place of the oscillation control unit 50 of the ring oscillators 3 to 5.

In the ring oscillators 3 to 5, a plurality of delay elements is connected in series and laid out across a plurality of stages, however, a plurality of delay elements connected in parallel may be laid out in a single stage. Further, in the ring oscillators 3 to 5, a plurality of delay elements is connected in parallel, however, a single delay element may be laid out across a plurality of stages.

The semiconductor device 107 has the SRAM cell array 121 and the ring oscillators 3 to 5, however, the ring oscillators 3 to 5 may be mounted one in each wafer in which the semiconductor device is formed. Further, in the semiconductor device 107, the ring oscillators 3 to 5 each have the control unit 40, however, it may also be possible to control each of the ring oscillators 3 to 5 by a signal control unit.

In the embodiments, a ring oscillator has a path circuit configured to output an output signal to a delay circuit in the next stage in response to transition other than one of transitions. Thus, it is possible to separately measure the rise delay time and the fall delay time, respectively, of the components forming the SRAM cell by using the ring oscillator.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A ring oscillator comprising a plurality of delay circuits to be ring-connected, wherein
    at least one of the plurality of delay circuits includes a delay element formed in a layout region including the same layout shape as the layout shape of an SRAM cell, and a path circuit connected in parallel to the delay element,
    the delay element outputs an output signal to a delay circuit in the next stage within the plurality of delay circuits in response to one of rise transition and fall transition of a signal input to an input terminal of the delay element from a delay circuit in the previous stage within the plurality of delay circuits, and
    the path circuit outputs an output signal to the delay circuit in the next stage in response to the transition other than the one transition, wherein
    a signal delayed by one of the delay element or the path circuit of the delay circuit in the previous stage is delayed by the other of the delay element or the path circuit of the delay circuit in the next stage.

2. The ring oscillator according to claim 1, wherein
    the delay element and the path circuit are connected in series across the plurality of stages, respectively, and the delay element and the path circuit output an inverted signal of an input signal as an output signal.

3. The ring oscillator according to claim 1, wherein
    the delay element includes one of an nMOS transistor to the gate of which an input signal is input and the source of which is grounded, and a pMOS transistor to the gate of which an input signal is input and the source of which is connected to a power source.

4. The ring oscillator according to claim 1, wherein
    in a layout region of the SRAM cell, a first transmission transistor, a second transmission transistor, a first pull-up transistor the gate of which is connected to the source of the second transmission transistor and the source of which is connected to a power source, a first pull-down transistor the gate of which is connected to the source of the second transmission transistor, the source of which is grounded, and the drain of which is connected to the source of the first transmission transistor, a second pull-up transistor the gate of which is connected to the drain of the first pull-up transistor, the source of which is connected to a power source, and the drain of which is connected to the source of the second transmission transistor, and a second pull-down transistor the gate of which is connected to the drain of the first pull-up transistor, the source of which is grounded, and the drain of which is connected to the source of the second transmission transistor are laid out, and
    the delay element includes the second pull-down transistor.

5. The ring oscillator according to claim 4, wherein
    the connections between the drain of the first pull-down transistor and the respective drains of the first pull-up transistor, the second pull-up transistor, and the second pull-down transistor are opened, and
    the opening is implemented by not possessing a via connecting wire layers formed in a layout region having the same layout shape as the layout shape of the SRAM cell.

6. The ring oscillator according to claim 1, wherein
    in a layout region of the SRAM cell, a first transmission transistor, a second transmission transistor, a first pull-up transistor the gate of which is connected to the source of the second transmission transistor, the source of which is opened, and the drain of which is connected to the source of the first transmission transistor, a first pull-down transistor the gate of which is connected to the source of the second transmission transistor, the source of which is grounded, and the drain of which is connected to the source of the first transmission transistor, a second pull-up transistor the gate of which is connected to the source of the first transmission transistor, the source of which is connected to a power source, and the drain of which is connected to the source of the second transmission transistor, and a second pull-down transistor the gate of which is connected to the source of the first transmission transistor, the source of which is grounded, and the drain of which is connected to the source of the second transmission transistor are laid out, and the delay element includes the second pull-up transistor.

7. The ring oscillator according to claim 6, wherein the connection between the source of the first pull-up transistor and the power source is opened, and the opening is implemented by not possessing a via connecting wire layers formed in a layout region having the same layout shape as the layout shape of the SRAM cell.

8. The ring oscillator according to claim 1, wherein the delay element and the path circuit are connected in series to the delay element and the path circuit in the previous stage and to the delay element and the path circuit in the subsequent stage, respectively.

9. The ring oscillator according to claim 1, wherein the delay elements are connected in parallel in plurality.

10. A semiconductor device comprising:

an SRAM cell array including a plurality of SRAM cells; and a ring oscillator comprising a plurality of delay circuits to be ring-connected, wherein:

at least one of the plurality of delay circuits includes a delay element formed in a layout region including the same layout shape as the layout shape of an SRAM cell, and a path circuit connected in parallel to the delay element, the delay element outputs an output signal to a delay circuit in the next stage within the plurality of delay circuits in response to one of rise transition and fall transition of a signal input to an input terminal of the delay element from a delay circuit in the previous stage within the plurality of delay circuits, and the path circuit outputs an output signal to the delay circuit in the next stage in response to the transition other than the one transition, wherein a signal delayed by one of the delay element or the path circuit of the delay circuit in the previous stage is delayed by the other of the delay element or the path circuit of the delay circuit in the next stage.

\* \* \* \* \*